US012643430B2

(12) United States Patent
Abbaraju et al.

(10) Patent No.: US 12,643,430 B2
(45) Date of Patent: Jun. 2, 2026

(54) BATTERY STATE OF HEALTH ESTIMATION BASED ON REAL-TIME DATA

(71) Applicant: Hitachi, Ltd., Tokyo (JP)

(72) Inventors: Praveen Abbaraju, Farmington Hills, MI (US); Subrata Kumar Kundu, Canton, MI (US); Xiaoliang Zhu, Northville, MI (US)

(73) Assignee: HITACHI, LTD., Tokyo (JP)

( * ) Notice: Subject to any disclaimer, the term of this patent is extended or adjusted under 35 U.S.C. 154(b) by 259 days.

(21) Appl. No.: 18/200,075

(22) Filed: May 22, 2023

(65) Prior Publication Data

US 2024/0391352 A1     Nov. 28, 2024

(51) Int. Cl.
*B60L 58/16* (2019.01)
*B60W 10/26* (2006.01)
(Continued)

(52) U.S. Cl.
CPC ............. *B60L 58/16* (2019.02); *B60W 10/26* (2013.01); *G01R 31/3648* (2013.01); *G01R 31/367* (2019.01); *G01R 31/392* (2019.01)

(58) Field of Classification Search
CPC .. B60L 58/16; B60L 2260/46; B60L 2260/50; B60L 58/12; B60W 10/26; G01R 31/3648; G01R 31/367; G01R 31/392
See application file for complete search history.

(56) References Cited

U.S. PATENT DOCUMENTS

| | | | | | |
|---|---|---|---|---|---|
| 11,065,978 | B2 * | 7/2021 | Aykol | ...................... | B60L 3/12 |
| 2005/0083014 | A1 * | 4/2005 | Baumgartner | ........ | H02J 7/0019 |
| | | | | | 320/116 |

(Continued)

FOREIGN PATENT DOCUMENTS

| | | | | | |
|---|---|---|---|---|---|
| CN | 114692827 | A | * | 7/2022 | |
| CN | 115841662 | A | * | 3/2023 | |
| EP | 1267146 | B1 | * | 5/2011 | ......... G01C 21/3484 |

OTHER PUBLICATIONS

Wikipedia page on Federated Learning (Apr. 27, 2023) downloaded from The Wayback Machine. (Year: 2023).*

(Continued)

*Primary Examiner* — Kito R Robinson
*Assistant Examiner* — Tanya C Sienko
(74) *Attorney, Agent, or Firm* — MATTINGLY & MALUR, PC

(57) ABSTRACT

In some examples, a system may determine route information for a route to be traversed by a vehicle from a start location to a destination location, the vehicle including a battery having a state of health. The system receives discharge data corresponding to traversal of the vehicle along the route, the discharge data indicative of a rate of discharge of the battery at a plurality of locations along the route. Based on the received discharge data, the system at least one of trains or updates a first machine learning model configured for predicting the state of health of the battery. The vehicle may determine an estimated battery state of health based at least on the first machine learning model, and may receive control information while traversing the route based on the estimated battery state of health to at least partially minimize battery degradation during traversal of the route.

19 Claims, 15 Drawing Sheets

(51) Int. Cl.
    *G01R 31/36*         (2020.01)
    *G01R 31/367*      (2019.01)
    *G01R 31/392*      (2019.01)

(56)            References Cited

U.S. PATENT DOCUMENTS

| | | | | |
|---|---|---|---|---|
| 2019/0294173 | A1* | 9/2019 | Szubbocsev | G05D 1/0274 |
| 2020/0011687 | A1* | 1/2020 | Lindemann | G01C 21/3469 |
| 2023/0288489 | A1* | 9/2023 | Jin | B60L 3/12 |
| 2023/0384391 | A1* | 11/2023 | Kwak | G01R 31/371 |
| 2024/0195197 | A1* | 6/2024 | Bennett | B60L 53/305 |

OTHER PUBLICATIONS

"Ensemble and continual federated learning for classification tasks" by F. E. Casado et al., Machine Learning (2013) published May 8, 2023 (Year: 2023).*

Machine translation of CN 114692827 downloaded off IP.com Feb. 9, 2025 (Year: 2025).*

Machine translation of CN 115841662 downloaded off IP.com Feb. 9, 2025 (Year: 2025).*

Diaz Alvarez, F. Serradilla Garcia, J. E. Naranjo, J. J. Anaya and F. Jimenez, "Modeling the Driving Behavior of Electric Vehicles Using Smartphones and Neural Networks," in IEEE Intelligent Transportation Systems Magazine, vol. 6, No. 3, pp. 44-53, Fall 2014, doi: 10.1109/MITS.2014.2322651. (Year: 2014).*

Lejun Jiang, Tamás G. Molnár, Gábor Orosz, "On the deployment of V2X roadside units for traffic prediction", Transportation Research Part C: Emerging Technologies, vol. 129, 2021, 103238, ISSN 0968-090X, https://doi.org/10.1016/j.trc.2021.103238. (Year: 2021).*

"Remaining driving range prediction for electric vehicles: Key challenges and outlook" Peng Mei et al, first published Apr. 30, 2023 Can be accessed at https://doi.org/10.1049/cth2.12486 IET Control Theory & Applications. vol. 17 Issue 14 pp. 1875-1893. (Year: 2023).*

"Health-Aware and User-Involved Battery Charging Management for Electric Vehicles: Linear Quadratic Strategies" H. Fang et al., IEEE Transactions on Control Systems Technology, vol. 25, No. 3 May 2017 pp. 911-923 (Year: 2017).*

"The challenge to the automotive battery industry: the battery has to become an increasingly integrated component within the vehicle electric power system" by Eberhard Meissner and Gerolf Richter, Journal of Power Sources vol. 144, Issue 2, Jun. 25, 2005, pp. 438-460 (Year: 2005).*

Wikipedia: Ensemble learning (in particular, the section on Stacking) downloaded from The Wayback Machine Mar. 14, 2023 save. (Year: 2023).*

"Probabilistic Prediction of Energy Demand and Driving Range for Electric Vehicles With Federated Learning" by A. Thorgeirsson et al., IEEE Open Journal of Vehicular Technology Apr. 9, 2021 version (originally pub. Mar. 11, 2021) (Year: 2021).*

* cited by examiner

700

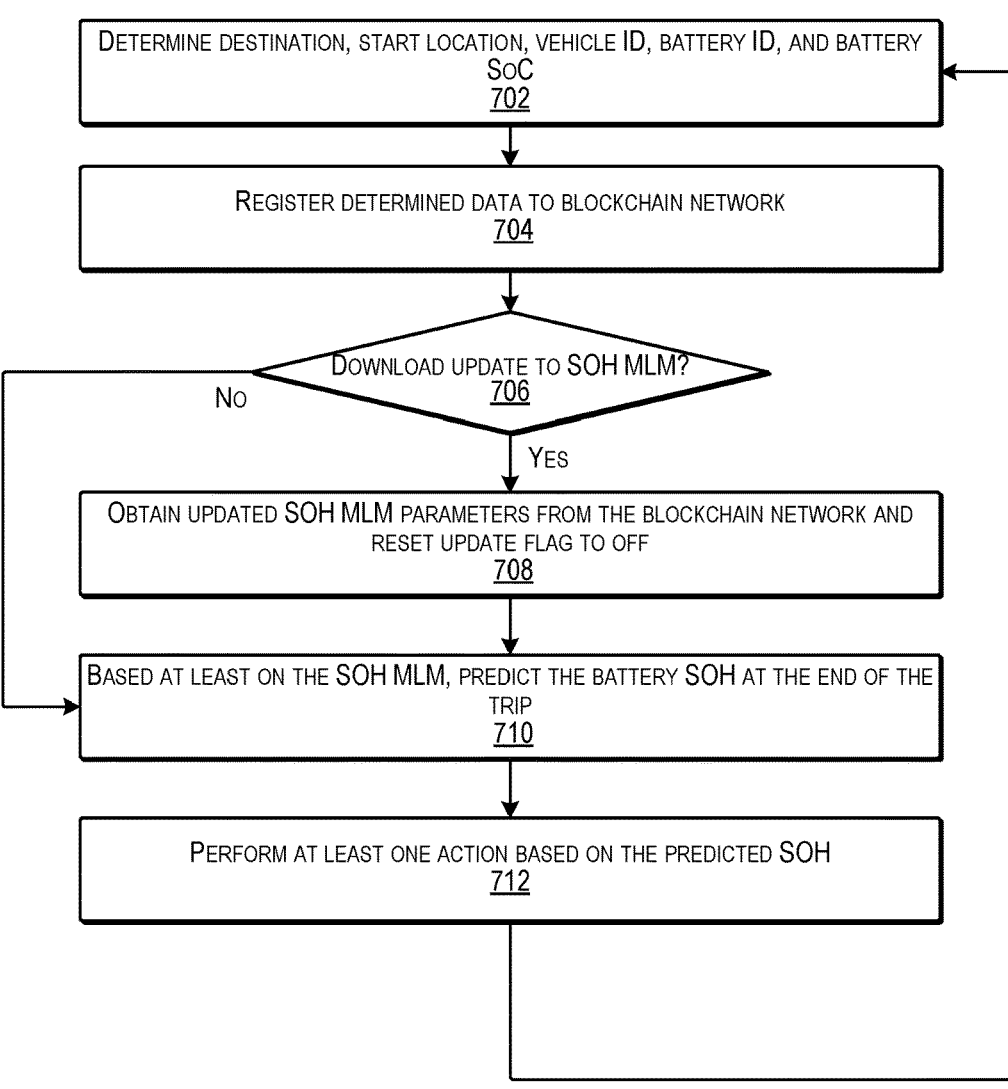

DETERMINE DESTINATION, START LOCATION, VEHICLE ID, BATTERY ID, AND BATTERY SoC
702

REGISTER DETERMINED DATA TO BLOCKCHAIN NETWORK
704

DOWNLOAD UPDATE TO SOH MLM?
706

No

YES

OBTAIN UPDATED SOH MLM PARAMETERS FROM THE BLOCKCHAIN NETWORK AND RESET UPDATE FLAG TO OFF
708

BASED AT LEAST ON THE SOH MLM, PREDICT THE BATTERY SOH AT THE END OF THE TRIP
710

PERFORM AT LEAST ONE ACTION BASED ON THE PREDICTED SOH
712

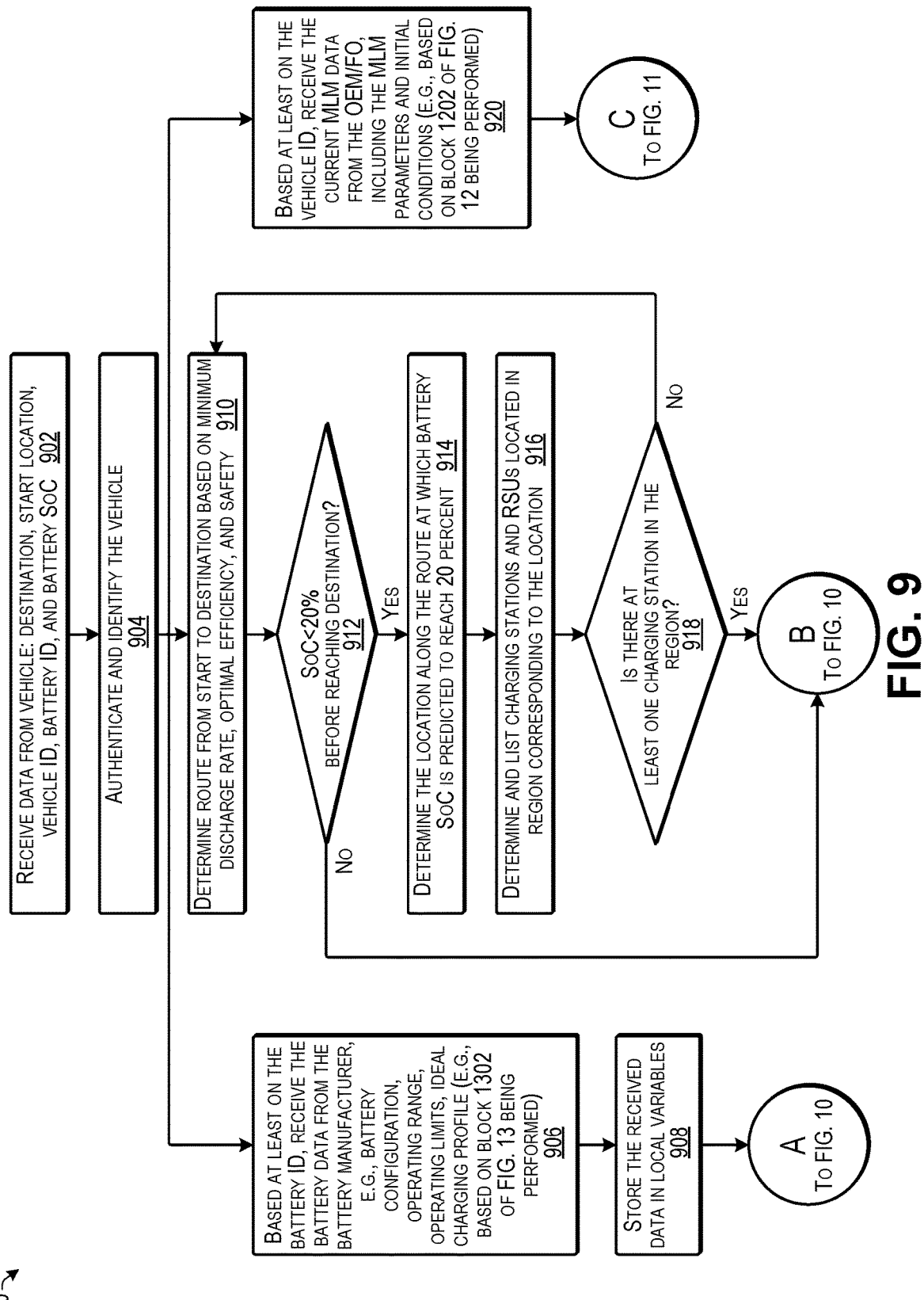

RECEIVE DATA FROM VEHICLE: DESTINATION, START LOCATION, VEHICLE ID, BATTERY ID, AND BATTERY SoC 902

AUTHENTICATE AND IDENTIFY THE VEHICLE 904

BASED AT LEAST ON THE BATTERY ID, RECEIVE THE BATTERY DATA FROM THE BATTERY MANUFACTURER, E.G., BATTERY CONFIGURATION, OPERATING RANGE, OPERATING LIMITS, IDEAL CHARGING PROFILE (E.G., BASED ON BLOCK 1302 OF FIG. 13 BEING PERFORMED) 906

STORE THE RECEIVED DATA IN LOCAL VARIABLES 908

A
TO FIG. 10

DETERMINE ROUTE FROM START TO DESTINATION BASED ON MINIMUM DISCHARGE RATE, OPTIMAL EFFICIENCY, AND SAFETY 910

SoC<20% BEFORE REACHING DESTINATION? 912

No

YES

DETERMINE THE LOCATION ALONG THE ROUTE AT WHICH BATTERY SoC IS PREDICTED TO REACH 20 PERCENT 914

DETERMINE AND LIST CHARGING STATIONS AND RSUs LOCATED IN REGION CORRESPONDING TO THE LOCATION 916

IS THERE AT LEAST ONE CHARGING STATION IN THE REGION? 918

No

YES

B
TO FIG. 10

BASED AT LEAST ON THE VEHICLE ID, RECEIVE THE CURRENT MLM DATA FROM THE OEM/FO, INCLUDING THE MLM PARAMETERS AND INITIAL CONDITIONS (E.G., BASED ON BLOCK 1202 OF FIG. 12 BEING PERFORMED) 920

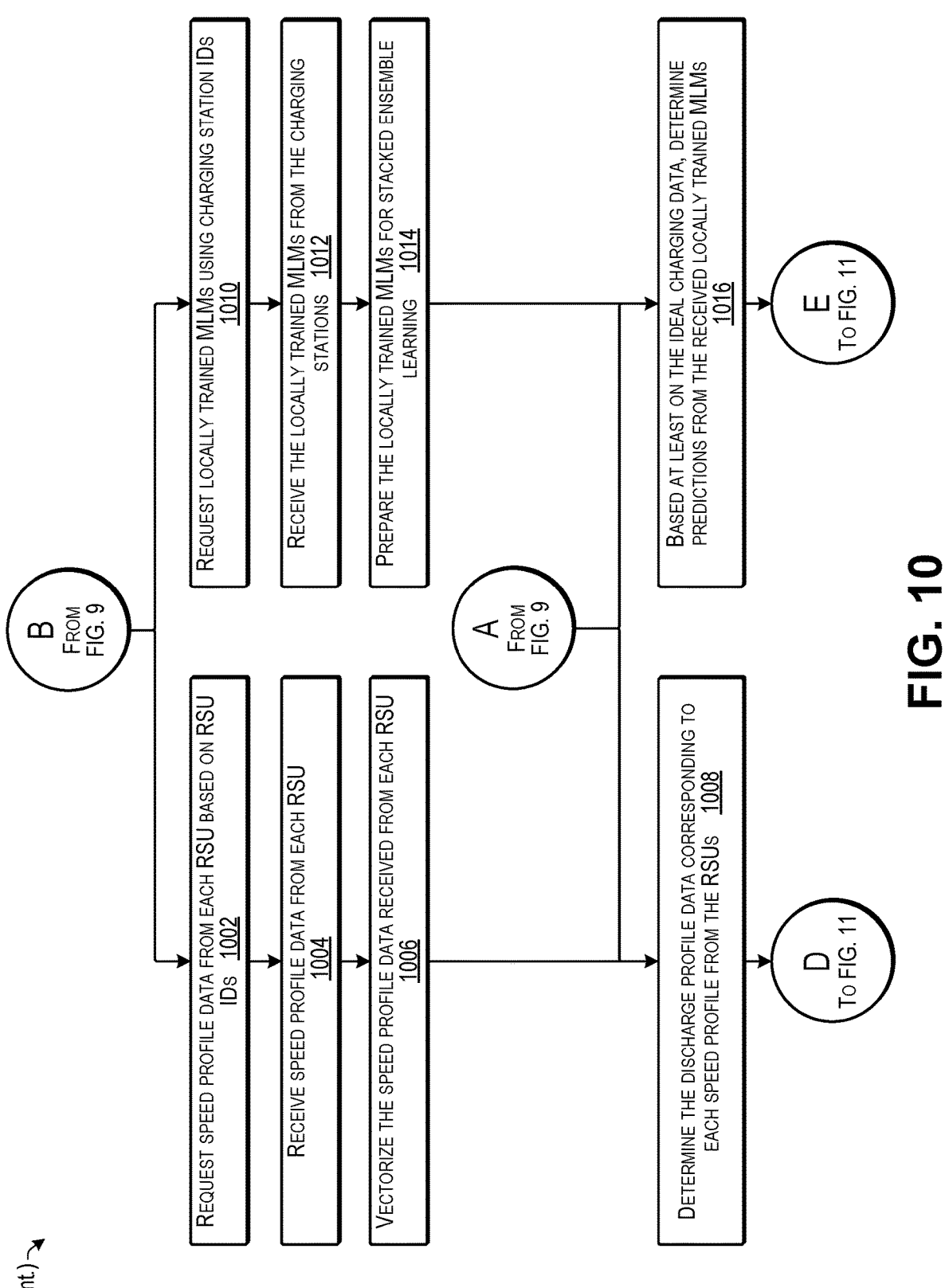

REQUEST LOCALLY TRAINED MLMs USING CHARGING STATION IDs
1010

RECEIVE THE LOCALLY TRAINED MLMs FROM THE CHARGING STATIONS    1012

PREPARE THE LOCALLY TRAINED MLMs FOR STACKED ENSEMBLE LEARNING    1014

BASED AT LEAST ON THE IDEAL CHARGING DATA, DETERMINE PREDICTIONS FROM THE RECEIVED LOCALLY TRAINED MLMs
1016

REQUEST SPEED PROFILE DATA FROM EACH RSU BASED ON RSU IDs    1002

RECEIVE SPEED PROFILE DATA FROM EACH RSU
1004

VECTORIZE THE SPEED PROFILE DATA RECEIVED FROM EACH RSU
1006

DETERMINE THE DISCHARGE PROFILE DATA CORRESPONDING TO EACH SPEED PROFILE FROM THE RSUs    1008

B
FROM FIG. 9

A
FROM FIG. 9

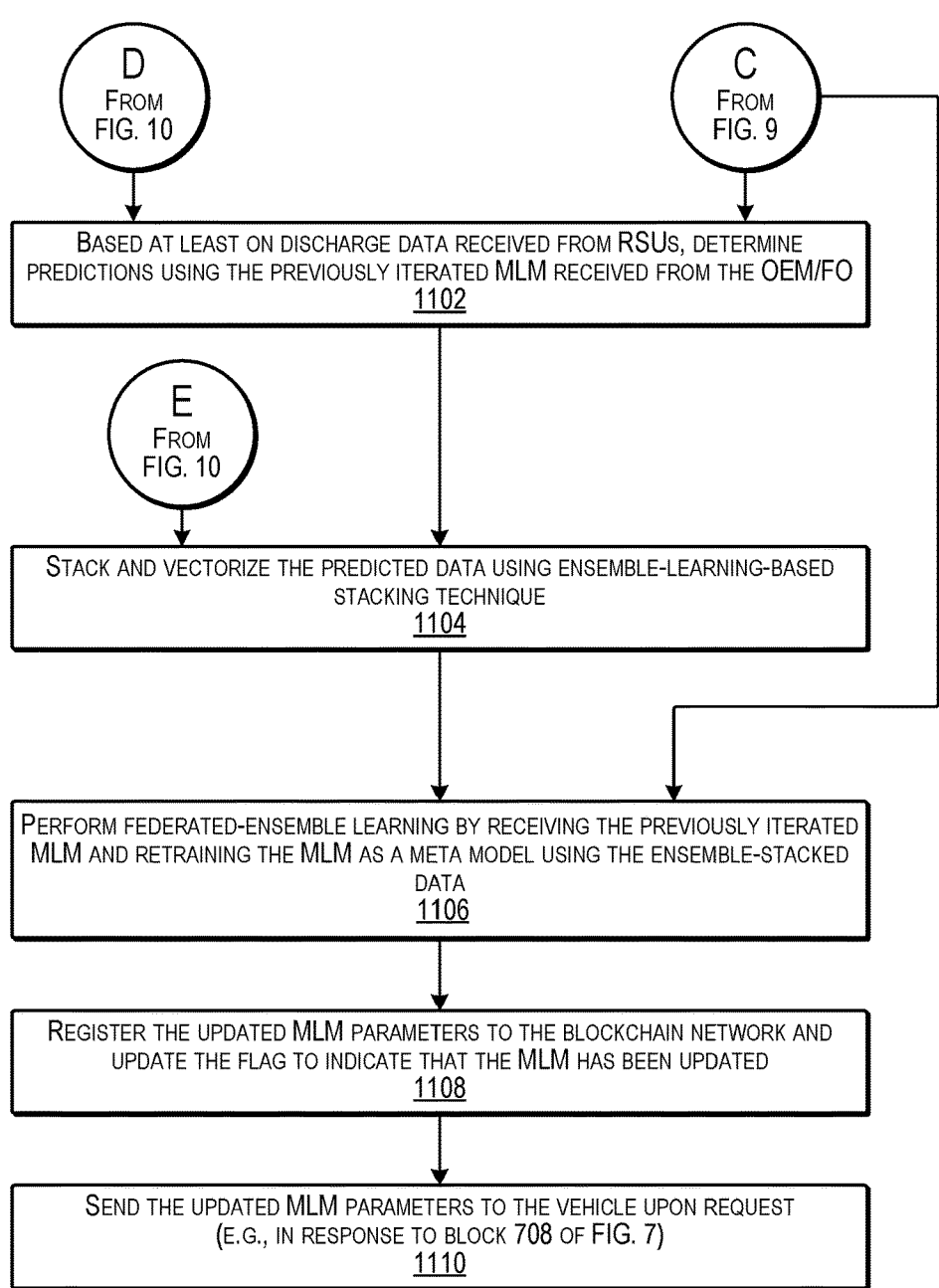

BASED AT LEAST ON DISCHARGE DATA RECEIVED FROM RSUS, DETERMINE PREDICTIONS USING THE PREVIOUSLY ITERATED MLM RECEIVED FROM THE OEM/FO
1102

STACK AND VECTORIZE THE PREDICTED DATA USING ENSEMBLE-LEARNING-BASED STACKING TECHNIQUE
1104

PERFORM FEDERATED-ENSEMBLE LEARNING BY RECEIVING THE PREVIOUSLY ITERATED MLM AND RETRAINING THE MLM AS A META MODEL USING THE ENSEMBLE-STACKED DATA
1106

REGISTER THE UPDATED MLM PARAMETERS TO THE BLOCKCHAIN NETWORK AND UPDATE THE FLAG TO INDICATE THAT THE MLM HAS BEEN UPDATED
1108

SEND THE UPDATED MLM PARAMETERS TO THE VEHICLE UPON REQUEST (E.G., IN RESPONSE TO BLOCK 708 OF FIG. 7)
1110

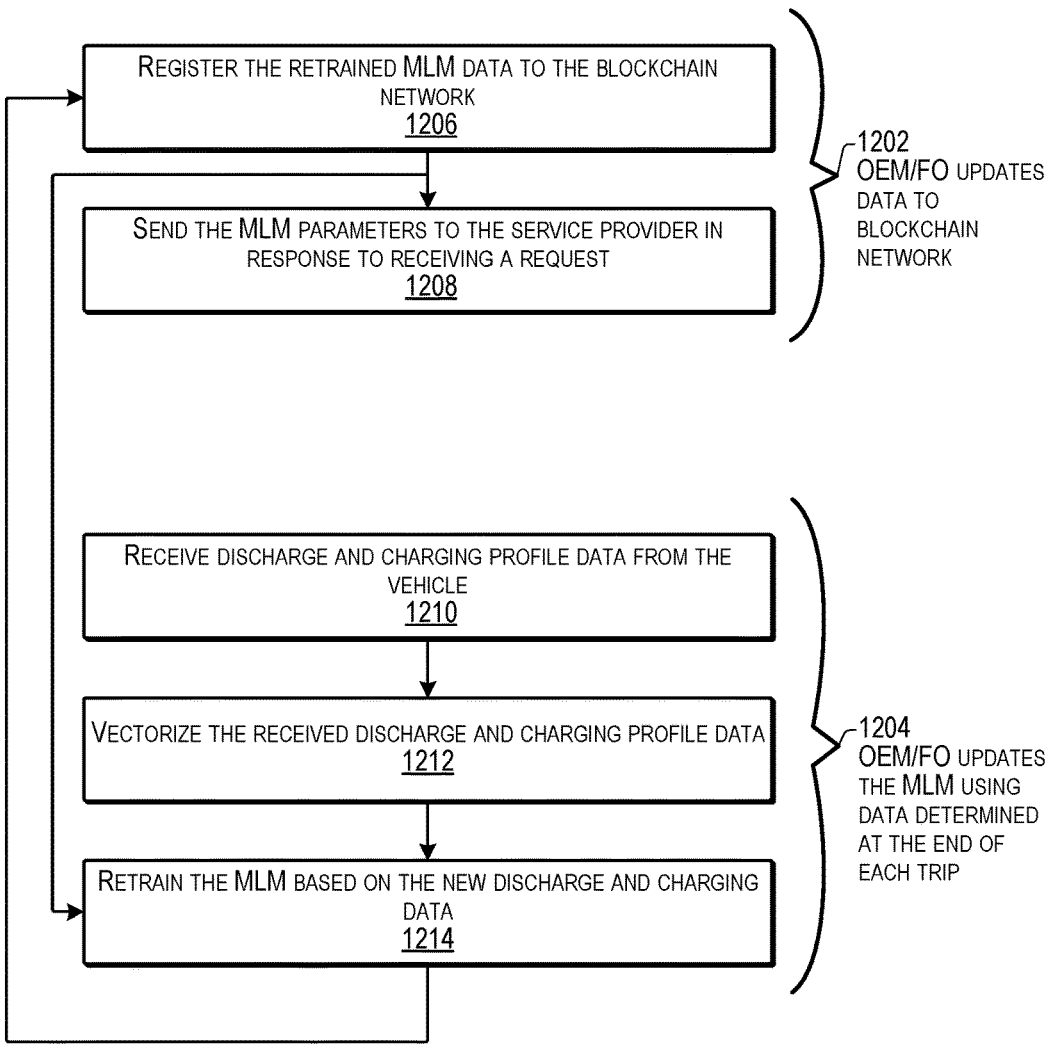

REGISTER THE RETRAINED MLM DATA TO THE BLOCKCHAIN NETWORK
1206

SEND THE MLM PARAMETERS TO THE SERVICE PROVIDER IN RESPONSE TO RECEIVING A REQUEST
1208

1202
OEM/FO UPDATES DATA TO BLOCKCHAIN NETWORK

RECEIVE DISCHARGE AND CHARGING PROFILE DATA FROM THE VEHICLE
1210

VECTORIZE THE RECEIVED DISCHARGE AND CHARGING PROFILE DATA
1212

RETRAIN THE MLM BASED ON THE NEW DISCHARGE AND CHARGING DATA
1214

1204
OEM/FO UPDATES THE MLM USING DATA DETERMINED AT THE END OF EACH TRIP

RECEIVE BATTERY ID FROM SERVICE PROVIDER
1302

OBTAIN BATTERY DATA BASED ON THE BATTERY ID, E.G., BATTERY CONFIGURATION, OPERATION RANGE, OPERATION LIMITS
1304

STORE BATTERY DATA IN BLOCK FORMAT TO ADD TO BLOCKCHAIN
1306

REGISTER THE BATTERY DATA BLOCK TO THE BLOCKCHAIN NETWORK ALONG WITH ADDITIONAL ENCRYPTION FOR DATA PRIVACY
1308

1400

RECEIVE A REQUEST FOR THE LOCALLY TRAINED SOH MLM
PARAMETERS
1402

OBTAIN THE SOH MLM PARAMETERS FOR THE LOCAL SOH MLM
TRAINED BASED ON THE CHARGING DATA
1404

REGISTER THE SOH MLM PARAMETERS TO THE BLOCKCHAIN
NETWORK
1406

SEND THE SOH MLM PARAMETERS TO THE SERVICE PROVIDER
WHEN A REQUEST IS RECEIVED USING CHARGING STATION ID
1408

1500

RECEIVE REQUEST FOR SPEED PROFILE DATA BASED ON RSU ID
1502

VERIFY THE RSU ID
1504

VECTORIZE THE SPEED PROFILE DATA
1506

REGISTER THE SPEED PROFILE DATA TO THE BLOCKCHAIN NETWORK
1508

SEND THE SPEED PROFILE DATA TO THE SERVICE PROVIDER WHEN
REQUESTED WITH RSU ID
1510

BATTERY STATE OF HEALTH ESTIMATION BASED ON REAL-TIME DATA

BACKGROUND

Electric vehicles (EVs) may use rechargeable batteries, such as lithium-ion batteries or other types of batteries, as a power source. Such rechargeable batteries may have a limited lifespan. For example, as a battery is repeatedly charged and discharged, the state of health (SOH) of the battery may degrade over time. The SOH may be representative of the current condition of the battery in comparison to the ideal condition of the battery. Examples of SOH parameters that are indicative of a battery's condition may include battery capacity, internal resistance/impedance/conductance, supplied voltage or amperage, tendency to self-discharge, and ability to accept a charge. Factors that may contribute to battery SOH degradation may include operator driving patterns, environmental conditions under which the vehicle is operated and stored, infrastructure and terrain over which the vehicle is operated, vehicle properties (e.g., vehicle weight, aerodynamics), number of charge/discharge cycles, extent to which the battery is fully charged and/or fully discharged at each cycle, and the age of the battery. Although battery SOH is an important consideration, accurately predicting the SOH and the effects that certain activities and events will have on the SOH can be challenging.

SUMMARY

In some implementations, one or more processors associated with a system may determine route information for a route to be traversed by a vehicle from a start location to a destination location, the vehicle including a battery having a state of health. The system receives discharge data corresponding to traversal of the vehicle along the route, the discharge data indicative of a rate of discharge of the battery at a plurality of locations along the route. Based on the received discharge data, the system trains and/or updates a first machine learning model configured for predicting the state of health of the battery. The vehicle may determine an estimated battery state of health based at least on the first machine learning model, and may receive control information while traversing the route based on the estimated battery state of health to at least partially minimize battery degradation during traversal of the route.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

FIG. 7 is a flow diagram illustrating an example process for predicting a battery SOH for a trip according to some implementations.

FIG. 9 illustrates an example of generating a trained MLM using federated and ensemble techniques according to some implementations.

FIG. 10 illustrates a continuation of the example process according to some implementations.

FIG. 11 illustrates a continuation of the example process according to some implementations.

FIG. 12 illustrates an example process that may be performed by the computing device of the OEM or fleet operator according to some implementations.

DETAILED DESCRIPTION

Figure 1:
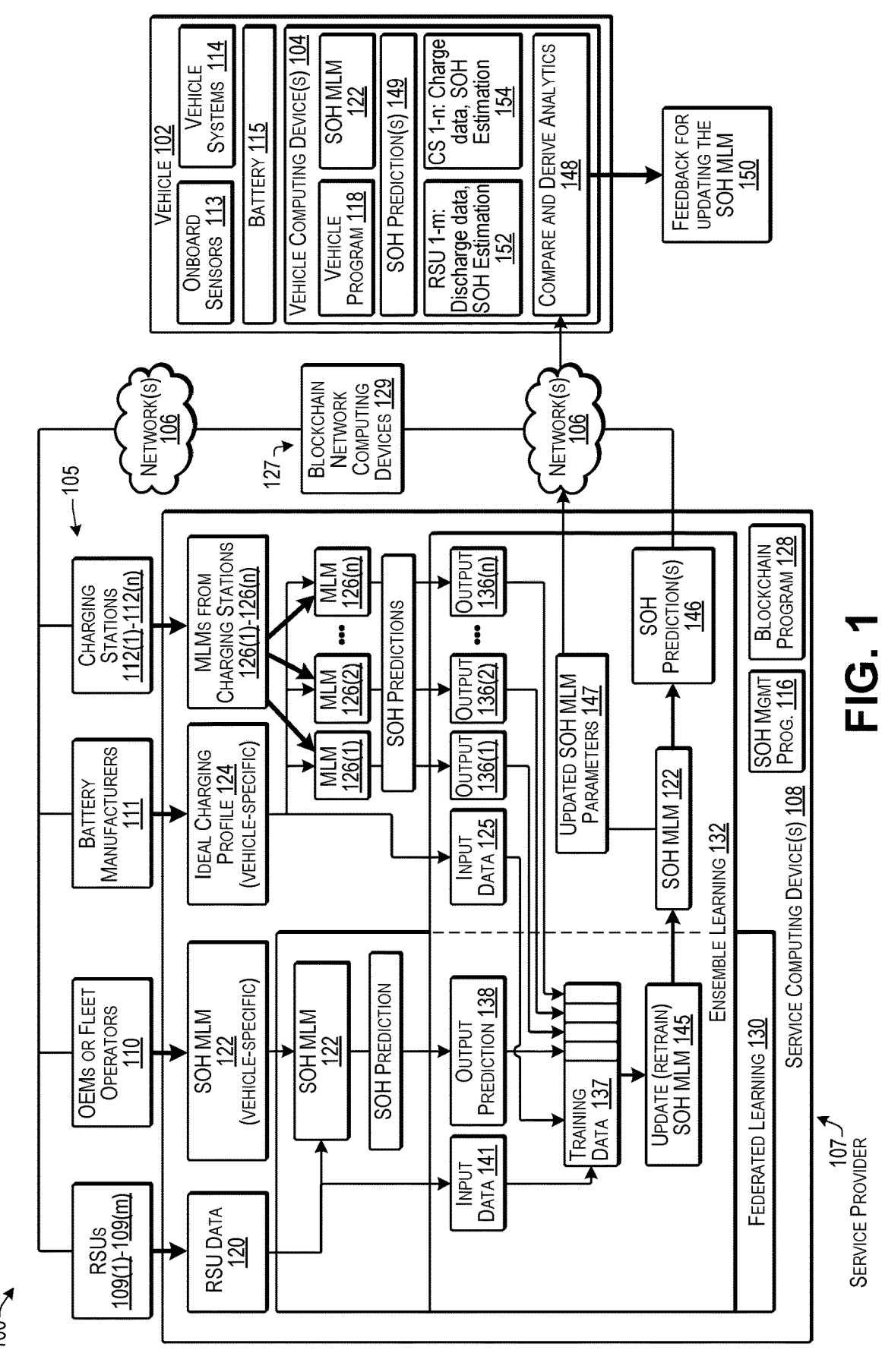
FIG. 1 illustrates a logical configuration of an example system able to predict and manage the state of health (SOH) of a battery according to some implementations.

Some implementations herein are directed to techniques and arrangements for maximizing battery state of health (SOH) for each trip traveled by a vehicle that employs a rechargeable battery as a power source for powering an electric motor that motivates the vehicle. In some cases herein, the battery SOH is accurately tracked using real-time attributes such as traffic, ambient temperature, and/or topology data that may be received from multiple stakeholders or other parties that may serve as information providers. Further, some examples enable data sharing among multiple information providers without exposing proprietary or confidential data. For instance, some types of data from certain parties, such as data from charging stations, battery manufacturers, and the like, may be employed for improving the accuracy of SOH estimations and may not be typically publicly available.

To address these challenges and provide predictions of battery SOH, some examples herein may utilize innovative machine learning techniques, which may include meta-learning techniques, as well as additional encryption techniques that can facilitate data sharing while maintaining data confidentiality. Additionally, some examples may provide information, instructions, or the like, to the end user (e.g., the vehicle owner, operator, etc.) regarding the predicted degradation of the battery SOH of the particular battery, such as based on the selected route(s), available charging station(s) and so forth. Providing this information may increase the transparency of the battery usage, enable the operator to determine preferred choices, and may help overcome range anxiety.

There is currently no industry standard technique for determining the SOH for a vehicle battery, such as due to data security issues and/or proprietary methodologies. Unlike conventional SOH estimation models, the examples herein may take into account real-time factors such as ambient temperature, traffic data, road topology, different charger types, and other factors that can greatly influence the health metrics of a battery, such as due to different charging and discharging profiles or the like. The examples herein provide an SOH prediction method and system that takes into consideration data from multiple information providers in real time and offers accurate predictions of battery SOH to a vehicle operator, owner, or the like, such as based on route choices, charging station choices, and the like.

Some examples herein may accurately predict vehicle battery SOH based on receiving information from different information providers, such as OEMs, fleet operators, roadside units (RSUs), charging stations, and battery manufacturers. The received information may provide real-time data regarding vehicle-specific charging and discharging profiles. Additionally, some examples herein may employ a blockchain data structure to enable safe and secure data sharing among various information providers.

Further, rather than sharing large datasets, some implementations may include sharing of trained machine learning models in federated fashion. In addition, to enable combining the estimations from a plurality of separately trained heterogeneous models, the examples herein may use meta learning concepts including ensemble learning algorithms to increase estimation accuracy while reducing the amount of data that is exchanged. Additionally, despite the limited data sharing herein, some data providers may still share proprietary information and may desire to limit access to the shared proprietary information, such as for preventing certain other parties from accessing the proprietary information. Accordingly, some implementations herein may include an additional encryption layer within the blocks of a blockchain maintained by a blockchain network, and which may be decrypted only through a special access key or the like.

Some implementations herein may take the charging technology used or predicted to be used into consideration when predicting SOH impact for a particular battery for a particular trip. For instance, different charging technologies (e.g., fast, traditional) may have an impact on the battery SOH, such as for causing a battery to reach its end-of-life earlier than anticipated. As one example, use of so-called fast chargers or superchargers may cause the battery SOH to degrade more quickly than lower voltage, slower charging technologies.

For discussion purposes, some example implementations are described in the environment of predicting the SOH for the battery of a vehicle, such as before, during, or following the completion of a trip. However, implementations herein are not limited to the particular examples provided, and may be extended to other types of vehicles, other types of machine learning techniques, other types of hardware configurations, other types of received information, other prediction timings, and so forth, as will be apparent to those of skill in the art in light of the disclosure herein.

FIG. 1 illustrates a logical configuration of an example system 100 able to predict and manage the SOH of a battery according to some implementations. The system 100 includes a vehicle 102 having one or more vehicle computing devices 104 able to communicate over one or more networks 106 with one or more service computing devices 108 of a service provider 107. In addition, the service computing device(s) 108, and in some cases, the vehicle computing device(s) 104 may be able to communicate over the one or more networks 106 with one or more information source computing devices (not shown in FIG. 1), such as web servers, service providers, public databases, private databases, or the like, of stakeholders or other information providers 105, which may include roadside units (RSUs) 109, original equipment manufacturers (OEMs) or fleet operators 110, battery manufacturers 111, and/or charging stations 112 in this example.

The vehicle 102 may further include one or more onboard sensors 113 and one or more vehicle systems 114 that are in communication with the vehicle computing device(s) 104, such as via a CAN bus (controller area network bus) or through any other suitable communication interfaces. In addition, the vehicle 102 may include a battery 115 that may provide power to the vehicle 102, which may be rechargeable, and which may have an SOH that can be predicted and monitored according to implementations herein. Implementations herein are not limited to any particular battery technology, battery type, vehicle type, or the like. Further, the vehicle computing device 104 may execute a vehicle program 118 that may communicate with at least the service computing device 108, as well as others of the information providers 105 in some examples.

The one or more networks 106 may include any appropriate network, including a wireless network, such as a cellular network; a wide area network, such as the Internet; a local area network, such an intranet; a local wireless network, such as Wi-Fi; close-range wireless communications, such as BLUETOOTH®; a wired network, including fiber optics and Ethernet; any combination thereof, or any other suitable communication network. Components used for such communication technologies can depend at least in part upon the type of network, the environment selected, or both. Protocols for communicating over such networks are well known and will not be discussed herein in detail.

In this example, an SOH management program 116 executing on the service computing device(s) 108 may receive or otherwise access RSU data 120 that may be received from one or more RSUs 109. In addition, the SOH management program 116 may receive or access an SOH MLM 122 that may be specific to the particular vehicle 102 in some examples. For instance, the SOH MLM 122 may be provided by an OEM or fleet operator 110 corresponding to the vehicle 102 and/or may be trained based at least on information received from the OEM or fleet operator 110. Additionally, the SOH management program 116 may receive or otherwise access an ideal charging profile 124 that may also be vehicle specific. For example, the ideal charging profile 124 may be vehicle-specific for the vehicle 102 and/or the battery 115, and may be received or otherwise obtained from the battery manufacturer 111 corresponding to the battery 115 installed in the vehicle 102. In addition, the service computing device(s) 108 may receive or otherwise access one or more SOH MLMs 126 from the charging stations 112, as described additionally below.

In some examples herein, the SOH of the battery 115 may be accurately estimated for various different scenarios based on data received by the service computing device 108 from multiple stakeholders or other information providers, such as the RSUs 109, the OEMs 110, the battery manufacturer 111, and the charging stations 112 to enable the service computing device(s) 108 to manage the SOH of the battery 115. Based on the received information, the service computing device(s) 108 may determine, such as for various different candidate routes for an upcoming trip or for other events that might occur to the vehicle, the predicted impact on the SOH of the battery 115. Based on determining the predicted impact on the SOH of the battery 115, the service computing device(s) 108 may send one or more control signals, instructions, or other communications to the vehicle 102 and/or to a vehicle owner or other vehicle operator.

Some implementations may execute a blockchain program 128 to utilize a blockchain network 127 that may include a one or more blockchain network computing devices 129 that may include one or more consensus nodes or other consensus mechanisms for generating and/or otherwise adding blocks for storing information in at least one blockchain (not shown in FIG. 1). For instance, the blockchain may be used to provide data security and integrity for data sharing among multiple information providers, such as the information providers 105 discussed above. For example, sharing large sets of data is not desirable for various reasons, such as due to possible incurred latencies, increased network congestion, and/or possible exposure of data that is desired to be kept confidential. Accordingly, some examples herein may include sharing of locally trained machine learning models (MLMs) 126 that can be provided as significantly smaller data blocks than the sets of data that were used to train these SOH MLMs 126. Accordingly, the techniques herein are able to reduce potential latencies in data sharing, reduce network congestion, and enable the data itself to be retained at the respective local source (e.g., the charging stations 112).

As one example, the SOH MLM 122 may be maintained and/or provided by the OEM corresponding to the vehicle 102. In other cases, the SOH MLM 122 may be maintained and/or provided by a fleet operator that operates a fleet of vehicles including the vehicle 102 for which the battery SOH is monitored and/or predicted. The SOH MLM 122 may be retrained with new data from the information providers corresponding to a selected route. However, certain information providers, such as the charging stations 112, may have large amounts of charging profile data that is not feasible to share with the service computing device(s) 108. Accordingly, in implementations herein, the SOH MLMs 126 from the charging stations 112 may be generated or otherwise trained locally at each charging station 112, and the trained SOH MLMs 126 may be shared with the service computing device(s) 108, rather than the charging data itself being shared by the charging stations 112. The SOH MLM 122 may be retrained in a federated learning fashion to tailor the estimations based on selected routes and using data on charging profiles received from charging stations 112, data on discharge profiles received from RSUs 109 due to traffic and road topology, and so forth.

The charging stations 112 may receive and retain data of charging profiles based on the charger types. As discussed above, instead of sharing large sets of data, locally trained SOH MLMs 126 are shared by the charging stations 112 to the service computing device 108. However, different charging stations 112 may have different models of chargers that may be proprietary to the charging station owner. Therefore, a new data set is generated based on the predictions from a plurality of the locally trained SOH MLMs 126. To realize this approach, some examples herein employ a stacked ensemble learning technique that combines the predictions output by a plurality of different locally trained SOH MLMs 126 received from a plurality of different charging stations 112, respectively, to train and update the SOH MLM 122. This technique is combined with the previously discussed federated learning approach to retrain the base SOH MLM 122 for SOH predictions based in part on the stacked data.

This is an innovative combination of federated and ensemble learning techniques that provides an advancement in machine learning technology.

Additionally, some data providers that participate in the SOH management system herein, may share limited sets of data (e.g., as opposed to sharing all collected data), and may be concerned with data integrity, confidentiality, and protecting against potential threats caused by data disclosure to competitors. For example, the battery operational performance at the start of the battery life may include information for determining ideal charging and discharging cycles. However, this information may be proprietary for the battery manufacturer 111. Accordingly, implementations herein may protect this data from access by unauthorized other parties within the SOH management system 100, such as other ones of the information providers 105. For instance, the service provider 107, a particular OEM or fleet operator 110, or the like, may have authorization from a particular battery manufacturer 111 to access that battery manufacturer's battery data. However, the system 100 herein may include an additional encrypted layer in the data stored in the blocks of that blockchain that store the battery profile information received from the battery manufacturers 111, and that can be decrypted only by authorized parties such as the service provider 107, a particular OEM or fleet operator 110, or the like.

The example of FIG. 1 includes a workflow for SOH prediction and management that includes the innovative federated-ensemble learning technique that combines elements of federated learning 130 with elements of ensemble learning 132. As one example, a deep learning technique LSTM (long short-term memory) model may be employed as the SOH MLM 122 herein, although implementations are not limited to any particular type of MLM.

In some cases, the vehicle-specific SOH MLM 122 may be retrained following each trip traversed by the vehicle 102, such as based on the current real-time data received from different information providers 105, which may include the RSUs 109(1)-109(m) and the charging stations 112(1)-112(n). As one example, considering each trip as an edge scenario, the SOH MLM 122 is trained in federated fashion with the updated data for newer trips. A federated learning approach is used to train a decentralized SOH MLM 122 across multiple edge scenarios, and newly trained SOH MLMs may be added to previously trained SOH MLMs to maintain the influence of historical data on the SOH MLM 122. For example, each different edge scenario may correspond to a different trip traversed by the vehicle 102. In some examples, the RSU data 120 (e.g., discharge profiles received from the RSUs 109(1)-109(m)) may be input into the SOH MLM 122 to determine an SOH prediction as an output prediction 138, which may be included in training data 137 in some examples for updating the SOH MLM 122.

Furthermore, the charging stations 112(1)-112(n) may collaboratively train a shared SOH MLM 126 while ensuring the training data stays local, and without being shared outside the service provider 107. At 145, the SOH MLM 122 is retrained or otherwise updated using the stacked training data 137. Following the updating the SOH MLM at 145, the SOH MLM 122 may be used to perform SOH prediction(s) 146. Accordingly, for performing the SOH prediction(s) 146, the SOH MLM 122 is retrained or otherwise updated based on data from one or more newer trips, i.e., the RSU data 120 from RSUs 109(1)-109(m) and with outputs 136(1), 136(2), . . . , 136(n), (e.g., SOH predictions) of the locally trained SOH MLMs 126(1), 126(2), . . . , 126(n), respectively, received from the charging stations 112(1)-112(n). In particular, a locally trained SOH MLM 126 may be associated with each respective charging station 112 such that for each charging station 112(1)-112(n), a separate MLM 126(1)-126(n) may be locally trained at the respective charging station 112(1)-112(n) with which the SOH MLM 126(1)-126(n) is associated. The ideal charging profile 124 may be used as input to each of the SOH MLMs 126(1)-126(n) to generate a plurality of SOH predictions as the outputs 136. However, the SOH MLMs 126(1)-126(n) from each charging station 112(1)-112(n) may not be identical. Therefore, implementations herein may combine the SOH MLMs 126(1)-126(n) according to one or more meta-learning approaches.

As one example, a stacked generalization in ensemble learning MLM learns to best combine the predictions (outputs 136) from two or more heterogeneous MLMs 126. The architecture of a stacking model involves two or more base models, often referred to as level-0 models, and a meta-model that combines the predictions of the base models, referred to as a level-1 model. According to the example of FIG. 1, all the SOH MLMs 126 from different charging stations 112 form the level-0 models. The prediction data (outputs 136(1)-136(n)) from level-0 is stacked as part of training data to train the meta-model. The LSTM model received from the previous iteration, is the meta-model in level-1. Additional data on discharge profiles derived from the RSU data 120 may be combined with the stacked data as the training data 137 that is used to retrain the SOH MLM 122 to obtain the updated SOH MLM 122. The retrained model is used by the vehicle to make predictions for the SOH estimation based on the selected route. In some examples, following training of the SOH MLM 122 to update the SOH MLM 122, the input data 125 (from the battery manufacturer) and the input data 141 (from the RSUs 109(1)-109(m)) may be input into the updated SOH MLM 122 by the service computing device to generate the SOH prediction(s) 146 of battery SOH for the individual battery 115. Thus, in some cases, the service computing device(s) 108 may predict the battery SOH for the vehicle 102 (or in addition to the vehicle 102), and may provide these battery SOH predictions to the vehicle 102 and/or the RSU 109 and/or the charging stations 112.

Additionally, the updated SOH MLM parameters 147 may be provided to the vehicle 102 to be used by the vehicle computing device 104 for generating one or more SOH predictions 149 that estimate the SOH of the vehicle battery 115 by execution of the SOH MLM 122. In some cases, the vehicle computing device may compare the estimated battery SOH with a measured battery SOH. Further, as one example, the vehicle 102 may use the SOH MLM 122 to predict, at the start of a trip, what the estimated battery SOH will be at the end of the trip. In addition, the vehicle 102 may execute the SOH MLM 122 at the end of the trip, such as by taking into account additional information obtained along the trip, e.g., battery discharge events and battery charge events to update the estimated SOH of the battery.

Further, the vehicle data, such as from RSUs 1-m may be captured along a route traversed by the vehicle 102 until the vehicle 102 reaches a destination location, and may include discharge data while the vehicle 102 travels along the route, such as state of charge (SOC) data and SOH estimation data based on this, as indicated at 152. In addition, the vehicle data may include charging data from charging stations 1-n, used along the route, and SOH estimation data based on this, as indicated at 154 (hereinafter "charging station data and SOH estimation data 154"). The vehicle program 118 may perform tracking of battery SOH estimations along the route and may communicate this information to the service computing device(s) 108, the RSUs 109 along the route, and the charging stations 112 along the route.

For example, the RSUs 109, upon receipt of the estimated battery SOH and current state of charge (SOC) of the vehicle battery, may provide, to the vehicle, recommended speed or other instructions that may be implemented by the vehicle computing device or a human driver when traversing a road segment for which the particular RSU 109 is responsible. Further, if the vehicle requires charging while traversing the route, the vehicle may communicate the estimated battery SOH and the current battery SOC to one or more of the charging stations 112. In response, a charging station that recharges the battery may determine how quickly to recharge the battery to avoid unnecessary degradation of the battery 115. For example, if the estimated battery SOH is low, e.g., below 70 percent, indicating that the battery is nearing end of life, the charging station 112 may use lower voltage/current to charge the battery than may be the case if the estimated battery SOH is higher, e.g., 85 percent or above.

After the trip has ended, information gathered about the vehicle 102 and/or gather by the vehicle 102 may be compared and detailed analytics may be derived as indicated at 148. For example, information regarding battery discharge and possible degradation of the battery may be sent, via the RSUs 109 along the route, to the service computing device 108. This information may include vehicle travel speed, sudden accelerations, stops, severe weather, and any other events that may cause battery degradation. Similarly, if the vehicle battery 115 is charged during or after the trip (i.e., a charging event takes place), the charging profile of the charging event may be sent by the corresponding charging station 112 to at least one of the vehicle 102, the service computing device 108, or the blockchain network 127. This data may be used to additionally retrain the SOH MLM 122 for the vehicle 102.

In addition, feedback for further updating of the SOH MLM 122, as indicated at 150, may be provided by the vehicle 102 (directly or via the blockchain network 127) to the OEM or fleet operator 110, such as to update the SOH MLM parameters for further improving the accuracy of the SOH MLM 122. Based on the information received from the vehicle 102, the RSUs along the route, the charging station(s) along the routed, and the like, the service computing device(s) 108 may further retrain the SOH MLM 122, and may provide at least the updated parameters for the SOH MLM 122 to the vehicle to enable the vehicle to estimate the current battery SOH and/or to compare the estimated battery SOH with a measured battery SOH.

Figure 2:
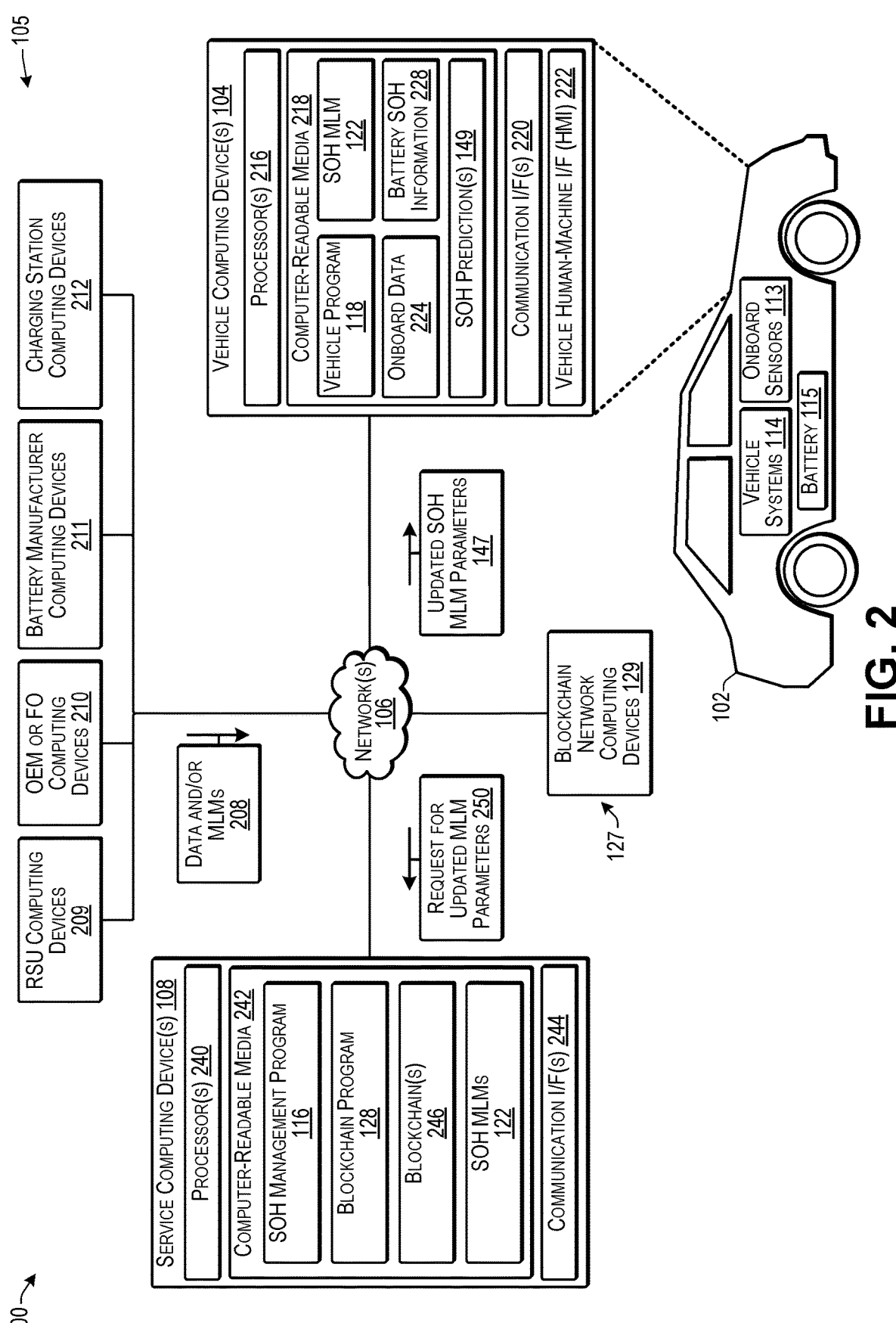
FIG. 2 illustrates an example hardware configuration of the system according to some implementations.

FIG. 2 illustrates an example hardware configuration of the system 100 according to some implementations. In this example, the service computing device(s) 108 and the vehicle computing device(s) 104 may be able to communicate over the one or more networks 106 with computing devices of the information providers 105 discussed above with respect to FIG. 1. These may include RSU computing devices 209, OEM computing device 210, Battery manufacturer computing devices 211, and charging station computing devices 212. Each of these entities may communicate, at least to the service computing device 108, data and/or MLMs 208, such as discussed above with respect to FIG. 1. In addition, while four types of information providers are illustrated in this example, various other types of information may also be provided to the service computing device 108 and/or the vehicle computing device(s) 104, from other types of information provider computing devices, such as for indicating the current and future weather conditions, traffic conditions, mapping information, and the like.

Each vehicle computing device 104 may include one or more processors 216, one or more computer-readable media 218, one or more communication interfaces (I/Fs) 220, and, in some examples, one or more vehicle human-machine interfaces (HMIs) 222. In some cases, the processors 216 may include one or more ECUs (electronic control units) or any of various other types of computing devices. "ECU" is a generic term for any embedded processing system that controls one or more of the systems, subsystems, or components in a vehicle. For instance, the vehicle computing device(s) 104 may include one or more ECUs as the processors 216 for controlling at least some of the vehicle systems 114. In some examples, the processors 216 may be configured to perform automated driving (AD) and/or advanced driver-assistance system (ADAS) tasks, such as navigation, braking, steering, acceleration, deceleration, and so forth. The vehicle computing device(s) 104 may also include one or more other ECUs or other types of processors 216, such as for controlling other ones of the vehicle systems 114, which may include managing charging of the battery 115 and/or monitoring discharge of the battery 115.

Software, such as the vehicle program 118, may be executed by the processors 216 and may be stored in a portion of the computer-readable media 218 (e.g., program ROM, solid state storage, etc., as discussed below) associated with the respective processor(s) 216 to enable the processors 216 to operate as an embedded system. Processors 216 may typically communicate with each other over a vehicle bus, such as a CAN bus, and according to a vehicle bus protocol.

The one or more processors 216, whether ECUs or otherwise, may include one or more of central processing units (CPUs), graphics processing units (GPUs), microprocessors, microcomputers, microcontrollers, digital signal processors, state machines, logic circuits, system on chip processors, and/or any devices that manipulate signals based on operational instructions. As one example, the processor(s) 216 may include one or more hardware processors and/or logic circuits of any suitable type specifically programmed or configured to execute the algorithms and other processes described herein. The processor(s) 216 may be configured to fetch and execute computer-readable instructions stored in the computer-readable media 218, which may program the processor(s) 216 to perform the functions described herein.

The computer-readable media 218 may include volatile and nonvolatile memory and/or removable and non-removable media implemented in any type of technology for storage of information, such as computer-readable instructions, data structures, programs, program modules, and other code or data. For example, the computer-readable media 218 may include, but is not limited to, RAM, ROM, EEPROM, flash memory or other memory technology, optical storage, solid state storage, magnetic disk(s), cloud storage, or any other medium that can be used to store the desired information and that can be accessed by a computing device. Depending on the configuration of the vehicle computing device(s) 104, the computer-readable media 218 may be a tangible non-transitory medium to the extent that, when mentioned, non-transitory computer-readable media exclude media such as energy, carrier signals, electromagnetic waves, and/or signals per se. In some cases, the computer-readable media 218 may be at the same location as the vehicle computing device 104, while in other examples, a portion of the computer-readable media 218 may be remote from the vehicle computing device 104.

The computer-readable media 218 may be used to store any number of functional components that are executable by the processor(s) 216. In many implementations, these functional components comprise instructions or programs that are executable by the processor(s) 216 and that, when executed, specifically program the processor(s) 216 to perform the actions attributed herein to the vehicle computing device 104. Functional components stored in the computer-readable media 218 may include the vehicle program 118, which may include one or more computer programs, applications, executable code, or portions thereof. Further, during use, some portions of this program may be executed on multiple separate processors 216 of the vehicle computing device(s) 104.

In addition, the computer-readable media 218 may store data, data structures, machine-learning models, and other information used for performing the functions and services described herein. For example, the computer-readable media 218 may store the most recent version of the SOH MLM 122 that corresponds to the respective vehicle 102. Examples of SOH MLMs 122 that may be used in some cases herein may include artificial neural networks, such as LSTM models, self-organizing neural networks, recurrent neural networks, convolutional neural networks, modular neural networks, deep learning neural networks, and so forth, as well as predictive models, decision trees, classifiers, regression models, such as linear regression models, support vector machines, stochastic models, such as Markov models and hidden Markov models, and the like.

Additionally, the computer-readable media 218 may store vehicle onboard data 224, such as sensor data received from the onboard sensors 113, systems data from the system 114, and various other types of data collected by the vehicle. In addition, the computer-readable media 218 may store battery SOH information 228 that may be received from the service computing device 108, the RSUs, the charging stations, or the like. For example, the battery SOH information 228 may include the RSU data 152, the charging station data and SOH estimation data 154, the analytics 148, and the feedback 150 discussed above with respect to FIG. 1. Additionally, as mentioned above, and as discussed additionally below, as the vehicle 102 traverses a route, the vehicle 102 may receive real-time information from the RSU computing devices 209, the charging station computing devices 212, and/or the service computing device(s) 108, such as based on the vehicle providing a current battery SOH prediction to one or more of these computing devices 209, 212, 108.

Further, while the data, data structures, functional components, and the SOH MLM 122 are illustrated together in this example, during use, some or all of these elements may be stored on or by separate ones of the computing device(s) 104. The computing device(s) 104 may also include or maintain other functional components and data, which may include programs, drivers, etc., and the data used or generated by the functional components. Further, the computing device(s) 104 may include many other logical, programmatic, and physical components, of which those described above are merely examples that are related to the discussion herein.

The one or more communication interfaces 220 may include one or more software and hardware components for enabling communication with various other devices, such as over a CAN bus and/or over the one or more network(s) 106. For example, the communication interface(s) 220 may enable communication through one or more of a LAN, the Internet, cable networks, cellular networks, wireless networks (e.g., Wi-Fi) and wired networks (e.g., CAN, Fibre Channel, fiber optic, Ethernet), direct connections, as well as close-range radio communications such as BLUETOOTH®, and the like, as additionally listed elsewhere herein.

The service computing device(s) 108 may include one or more servers or other types of computing devices that may be embodied in any number of ways. For instance, in the case of a server, the programs, other functional components, and data may be implemented on a single server, a cluster of servers, a server farm or data center, a cloud-hosted computing service, and so forth, although other computer architectures may additionally or alternatively be used.

Further, while the figures illustrate the functional components and data of the service computing device 108 as being present in a single location, these components and data may alternatively be distributed across different computing devices and different locations in any manner. Consequently, the functions may be implemented by one or more server computing devices, with the various functionality described herein distributed in various ways across the different computing devices. Multiple service computing devices 108 may be located together or separately, and organized, for example, as virtual servers, server banks, and/or server farms. The described functionality may be provided by the servers of a single entity or enterprise, or may be provided by the servers and/or services of multiple different entities or enterprises.

In the illustrated example, each service computing device 108 may include one or more processors 240, one or more computer-readable media 242, and one or more communication interfaces 244. Each processor 240 may be a single processing unit or a number of processing units, and may include single or multiple computing units or multiple processing cores. The processor(s) 240 can be implemented as one or more microprocessors, microcomputers, microcontrollers, digital signal processors, central processing units, system-on-chip processors, state machines, logic circuitries, and/or any devices that manipulate signals based on operational instructions. For instance, the processor(s) 240 may be one or more hardware processors and/or logic circuits of any suitable type specifically programmed or configured to execute the algorithms and processes described herein. The processor(s) 240 can be configured to fetch and execute computer-readable instructions stored in the computer-readable media 242, which can program the processor(s) 240 to perform the functions described herein.

The computer-readable media 242 may include volatile and nonvolatile memory and/or removable and non-removable media implemented in any type of technology for storage of information, such as computer-readable instructions, data structures, program modules, or other data. Such computer-readable media 242 may include, but is not limited to, RAM, ROM, EEPROM, flash memory or other memory technology, optical storage, solid state storage, magnetic tape, magnetic disk storage, storage arrays, network attached storage, storage area networks, cloud storage, or any other medium that can be used to store the desired information and that can be accessed by a computing device. Depending on the configuration of the service computing device 108, the computer-readable media 242 may be a type of computer-readable storage media and/or may be a tangible non-transitory media to the extent that when mentioned herein, non-transitory computer-readable media exclude media such as energy, carrier signals, electromagnetic waves, and signals per se.

The computer-readable media 242 may be used to store any number of functional components that are executable by the processors 240. In many implementations, these functional components comprise instructions or programs that are executable by the processors 240 and that, when executed, specifically configure the one or more processors 240 to perform the actions attributed above to the service computing device 108. Functional components stored in the computer-readable media 242 may include the SOH management program 116 and the blockchain program 128.

In addition, the computer-readable media 242 may store data used for performing the operations described herein. Thus, the computer-readable media 242 may include a blockchain 246. As is known in the art, a blockchain includes a ledger type data structure composed of a plurality of blocks. The computer-readable media 242 may further include the SOH MLMs 122, as discussed above. Further, the service computing device 108 may also include or maintain other functional components and data not specifically shown in FIG. 2, which may include programs, drivers, etc., and the data used or generated by the functional components. Additionally, the service computing device 108 may include many other logical, programmatic, and physical components, of which those described above are merely examples that are related to the discussion herein.

In some examples herein, following updating of the SOH MLM 122, the vehicle program may send a request 250 for updated machine learning model parameters prior to execution of the updated SOH MLM 122 on the vehicle computing devices 104. In reply, the service computing device 108 may send at least the updated SOH MLM parameters 147 to the vehicle computing device 104 in response to the request 250. Alternatively, as another example, the service computing device 108 may send the entire SOH MLM 122 to the vehicle 102 following updating.

The communication interface(s) 244 may include one or more interfaces and hardware components for enabling communication with various other devices, such as over the network(s) 106. For example, communication interface(s) 244 may enable communication through one or more of the Internet, cable networks, cellular networks, wireless networks (e.g., Wi-Fi) and wired networks (e.g., fiber optic and Ethernet), as well as close-range radio communications, such as BLUETOOTH®, BLUETOOTH® low energy, and the like, as additionally enumerated elsewhere herein.

The information provider computing devices 209-212 may have hardware configurations similar to those of the service computing device(s) 108, but with different data and functional components. Furthermore, while one example of a computing system architecture is illustrated in FIG. 2, numerous other architectures and alternative computing system configurations will be apparent to those of skill in the art having the benefit of the disclosure herein.

Figure 3:
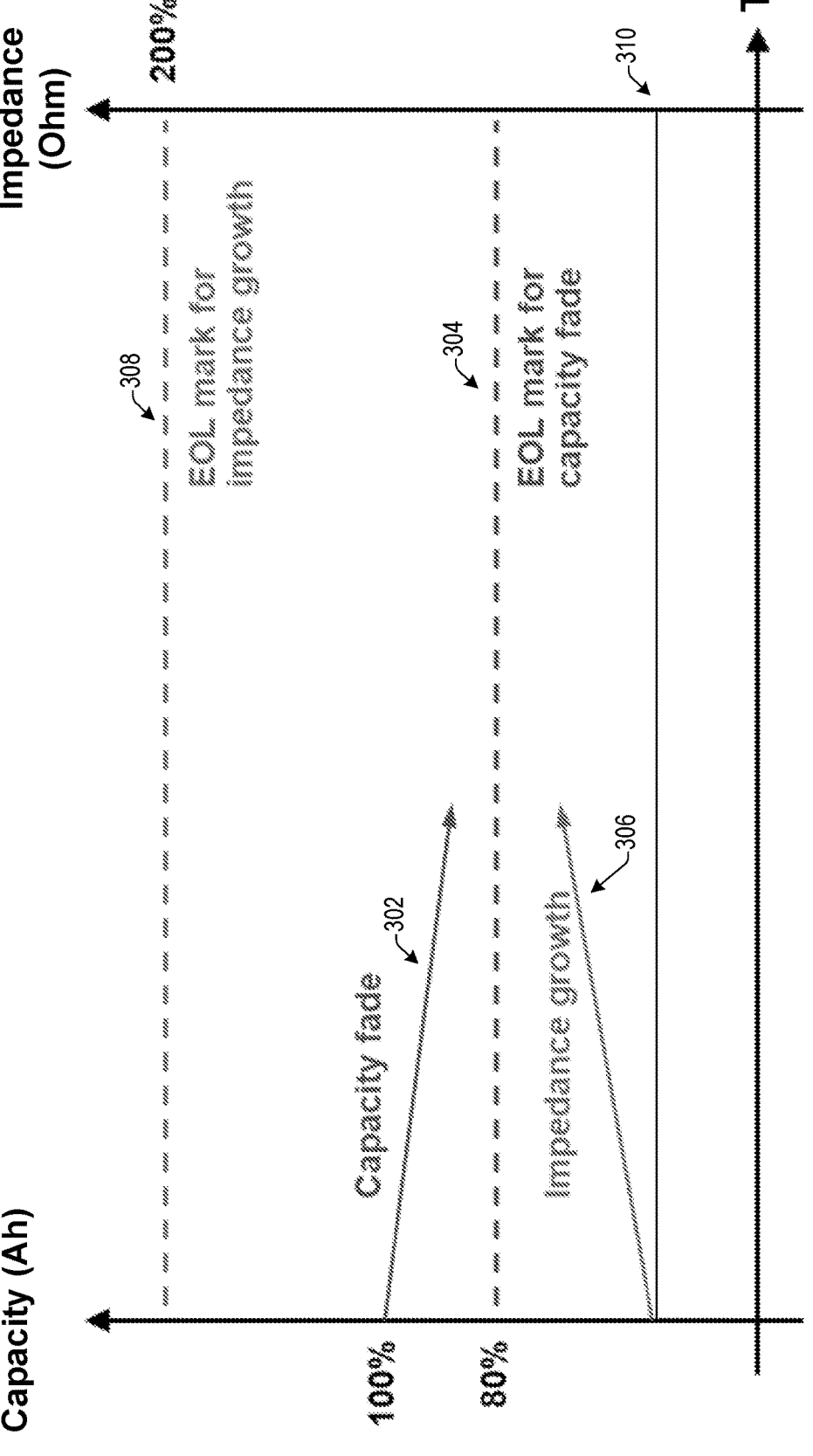
FIG. 3 illustrates an example graph showing battery capacity fade according to some implementations.

FIG. 3 illustrates an example graph 300 showing battery capacity fade 302 according to some implementations. In some examples herein, the battery SOH may be indicated by the ratio of the current total maximum battery capacity in kilowatt hours (kWh) in comparison to the rated capacity of the battery, e.g., as specified by the battery manufacturer, in kWh. For instance, kWh may be an indication of the total amount of energy that the battery is able to store. Similarly, ampere hours (Ah) indicates the total amount of current that a battery can supply in an hour, and can also be used as an indication of battery SOH, such as to provide an indication of capacity fade of the battery cells. The measured decrease in battery capacity over time is referred to as capacity fade 302. Under some common OEM guidelines, the end of life (EOL) for a vehicle battery determined based on capacity fade may be the point at which SOH reaches 80 percent, as indicated at 304. When the EOL 304 is reached, the battery may be replaced with a new battery, and original battery may be recycled, repurposed, or the like. As shown in FIG. 3, the SOH can be measured over time T based on change in capacity (kWh or Ah) as the tracked capacity fade 302.

Additionally, or alternatively, the SOH of the battery may be determined based on the impedance 306 measured in the battery (e.g., in Ohms), which represents the thermal limit of the battery. As indicated at 306, the impedance grows over time T as the capacity fades. As indicated at 308, according to some guidelines, the EOL for impedance is when the impedance has increased to 200 percent over the original battery impedance 310 measured when the battery was new. Further, while the graph 300 shows example capacity fade 302 and example impedance growth 306 as being generally linear functions in this example, in the real world, this may not necessarily be the case, as certain events may have a more significant impact on battery capacity and/or imped-ance than others. For example, use of a supercharger mul-tiple times over a short period may have a larger impact on battery SOH than charging using a lower power charging system the same number of times over a longer period. Further, estimating the SOH (as opposed to measuring the SOH) may be complicated as multiple factors such as ambient environment, charge and discharge cycles, driving patterns, and the like, may contribute differently towards aging effects on the battery.

The vehicle battery SOH is dependent on various factors such as charging based on different charger types, discharge based on the traffic and topology of a route, and the ambient temperature in which the vehicle is operating. Accurate prediction of all such factors for predicting an effect on SOH of a particular battery can be challenging and may result in the use of inaccurate model-based predictions for SOH estimations. In the examples herein, real-time data from the multiple information providers 105 may help to ensure an accurate SOH estimation. The examples herein may employ innovative techniques for obtaining and applying real-time information from multiple information providers that are willing to participate and leverage data sharing for different applications.

Figure 4:
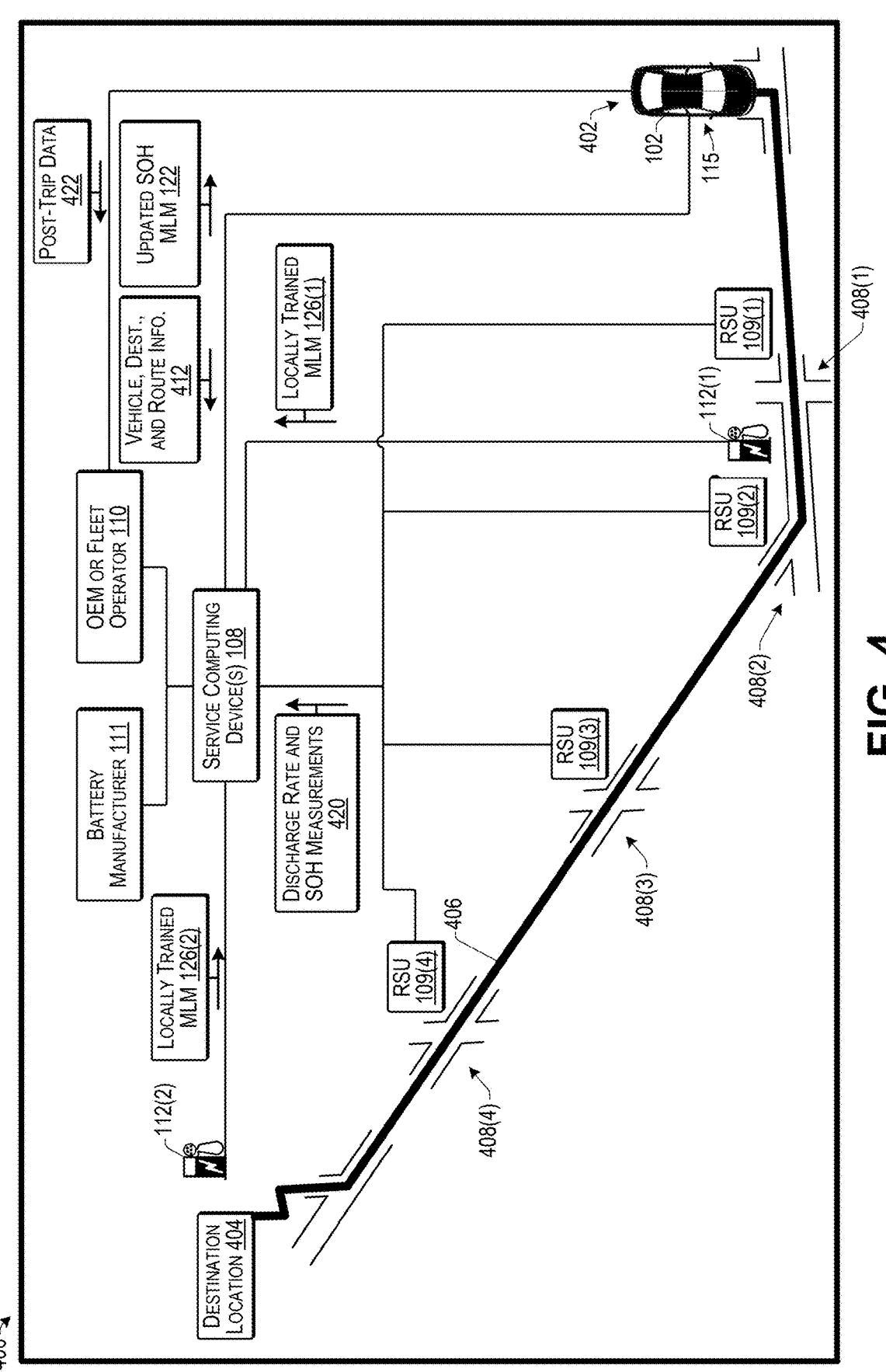
FIG. 4 illustrates an example trip with battery SOH management for the vehicle according to some implementations.

FIG. 4 illustrates an example trip 400 with battery SOH management for the vehicle 102 according to some imple-mentations. In some cases, the example of FIG. 4 may be executed by the system 100 discussed above with respect to FIGS. 1 and 2. The system may account for real-time data from multiple information providers to accurately estimate the SOH of the battery 115 of the vehicle 102 at the end of the trip 400 and/or for controlling the vehicle 102 during the trip to maximize the battery SOH by the end of the trip. The service computing device 108 is able to communicate safely and reliably with multiple information providers, such as a plurality of RSUs 109(1)-109(4), an OEM or fleet operator 110, a battery manufacturer 111, and a plurality of charging stations 112(1)-112(2). Further, some examples herein may use blockchain technology and/or added encryption layers to ensure data integrity and reliability, and may leverage vehicle standards and data sharing among different infor-mation providers.

As mentioned above, the service computing device 108 may execute the SOH management program 116 (not shown in FIG. 4) to perform at least some of the described functions for determining battery SOH. For example, sharing large amounts of data among the participating parties would be undesirable, such as by hindering the computations performed herein with communication latencies, network con-gestion, and the like. Accordingly, some examples herein include sharing of locally trained SOH MLMs 126 and combining these locally trained SOH MLMs 126 using a novel federated-ensemble learning technique to ensure data security and improved accuracy. In some cases, data and communications may be protected and secured through the use of a blockchain network 127.

In the illustrated example, suppose that the vehicle 102 is initially located at an origin location 402 and is targeted to travel to a destination location 404. Along a selected route 406, suppose that there are two charging stations 112(1) and 112(2), and four road-side units (RSUs) 109(1)-109(4), namely one RSU 109 at each major intersection 408(1)-408(4), respectively, or other type of road segment, along the route 406. The service provider 107 may communicate with the charging stations 112(1) and 112(2), the RSUs 109(1)-109(4), the OEM or fleet operator 110, the battery manu-facturer 111, and the vehicle 102 for performing SOH estimation in real-time. Instead of sharing large datasets, the SOH MLMs 126(1) and 126(2) that may be locally trained by the charging stations 112(1) and 112(2), respectively, using individual datasets are shared over the network with the service computing device 108. For example, because the charging stations 112 share trained MLMs 126 instead of sharing large data sets, network congestion is reduced, privacy of the charging station training data is maintained, and the speed and efficiency of the real-time battery SOH prediction is improved.

Furthermore, certain information providers in the system, such as the battery manufacturer 111, may desire to share battery proprietary information only with authorized parties such as the service provider 107, certain OEMs, certain fleet operators, or the like. Therefore, in examples herein the employed machine learning techniques may fuse federated learning and ensemble learning to efficiently combine infor-mation from different information providers. Additionally, an encryption layer within a blockchain ledger may be used to store proprietary information that may be decrypted only by the authorized parties, thereby ensuring a higher level of data security and integrity.

In the illustrated example, at the start of the trip, the service computing device 108 may receive vehicle informa-tion, destination information, and route information 412 regarding an upcoming trip intended to be traversed by the vehicle 102 from the start location 402 to the destination location 404. The service computing device 108 may iden-tify the vehicle 102 based on the received information 412, and may send an inquiry to the corresponding OEM or fleet operator 110 to share the previous SOH MLM for the particular vehicle 102 and battery 115.

In addition, the RSUs 109(1)-109(4) along the route 406 may share real-time traffic information with the service computing device 108, and which may be considered when determining a discharge profile for the vehicle 102 for the trip. For instance, the discharge profile for a specific vehicle may be dependent, at least in part, on the battery configu-ration and ideal performance details that the battery manu-facturer 111 shares with service computing device 108. Since the battery information may be proprietary data, the service computing device 108 may employ an additional encryption layer within the blockchain ledger that, in some examples, can only be decrypted by the service provider 107.

Additionally, the charging stations 112(1) and 112(2) along the route 406 may share the locally trained SOH MLMs 126 that are based on the charger type and charging profiles of the respective individual charging stations 112(1) and 112(2). For instance, the locally trained SOH MLMs at the different charging stations 112(1) and 112(2) may be heterogeneous, such as due to differences in the types of chargers present at the respective charging stations 112(1) and 112(2). Based on this, implementations herein may employ ensemble learning techniques to combine the estimations determined based on the multiple locally trained SOH MLMs 126(1) and 126(2). With the limited data shared from the RSUs 109(1)-109(4), and the combined output from the SOH MLMs 126(1) and 126(2) of the charging stations 112(1) and 112(2), respectively, the previous SOH MLM 122 from OEM or fleet operator 110 may be retrained or otherwise updated using a federated learning technique. The updated SOH MLM 122 may be shared back to the vehicle 102 for enabling the vehicle 102 to perform an accurate estimation of the SOH of the battery 115, such as prior to starting the trip or during the trip from the origin location 402 to destination location 404. Additionally, as the vehicle 102 traverses along the route 406, the vehicle 102 may share discharge rate and SOH measurements 420 (including the current state of charge of the battery 115) and the current estimated battery SOH with the RSUs 109 located along the route 406, such as when the vehicle 102 passes near each RSU 109(1)-109(4). This feedback data from the vehicle 102 may be accumulated and further processed at the end of the trip to provide post-trip data 422 to the OEM or fleet operator 110 for improving the accuracy of the SOH MLM 122. Additional details of each information provider's functions are provided below.

Furthermore, as the vehicle 102 traverses along the route 406, the vehicle 102 may share the current estimated battery SOH that is predicted by the SOH MLM 122 at the start of the trip or by re-execution of the SOH MLM 122 during the trip. For example, based on receiving the estimated battery SOH and the state of charge information from the vehicle 102, each RSU 109(1)-109(4) along the route 406 may provide information to the vehicle to help maximize the vehicle battery SOH by the end of the trip. For example, based on receiving the estimated battery SOH and SOC, the RSUs 109(1)-109(4) may provide vehicle control information (e.g., a speed profile) to the vehicle 102 to use when traversing the road segment with which the respective RSU 109 is associated. As one example, if the estimated SOH is relatively high, indicating good battery SOH, such as 85 percent remaining capacity or higher, the RSU may provide a speed profile to the vehicle for a corresponding road segment that may include, e.g., harder acceleration and/or braking scenarios, higher speeds, or the like.

On the other hand, if the estimated battery SOH is relatively low, e.g., less than 70 percent capacity remaining, which may indicate that the battery is nearing end of life, the RSU may provide a less strenuous speed profile to the vehicle to help preserve the battery capacity and maximize the battery SOH over the course of the trip. For instance, in the case that the vehicle is operated by a human, the vehicle control information may be provided via a human-machine interface (HMI), such as a display or by an audio notification, or the like. Alternatively, in the case that the vehicle navigation is controlled by the vehicle computing device 104, such as in the case that the vehicle is autonomous or semi-autonomous, the vehicle control program may receive the vehicle control information, and may control the speed of the vehicle 102 along the road segment based at least on the received speed profile.

In some cases, the RSUs 109 may optimize the vehicle control information provided to the vehicle 102 based on at least three parameters, namely, a speed limit for traversal of the corresponding road segment, a current traffic situation at the corresponding road segment, and the current estimated SOH for the vehicle 102. Based at least on these three parameters, the respective RSU may provide a speed profile for the vehicle 102 to use during traversal of the road segment corresponding to each respective RSU 109(1)-109(4). The provision of the vehicle control information can help minimize battery degradation during the trip for maximizing the battery SOH by the end of the trip.

Similarly, should the vehicle battery 115 require charging along the route 406, the vehicle 102 may communicate the estimated battery SOH and current battery SOC to a selected charging station 112. In response, the charging station 112 may determine a suitable charging profile to use for the vehicle 102 to minimize degradation of the vehicle battery SOH. As one example, if the estimated battery SOH is relatively low (e.g., indicative that the battery is nearing end of life), the charging station 112 may select a lower voltage/power charging profile to help preserve the remaining battery life, whereas if the estimated battery SOH is predicted to be relatively high or otherwise in good condition, e.g., little capacity has been lost, the charging station 112 may select a higher voltage/power charging profile to charge the battery more quickly. Further, as mentioned above, the SOH MLM may be executed one or more additional times as the vehicle 102 traverses along the route to provide an updated estimated battery SOH, such as based on battery discharge and charge events that have occurred while traversing the route. Thus, the estimated battery SOH provided by the SOH MLM 122 to the RSUs 109 and/or the charging stations 112 located along the route 406 can help ensure that the vehicle battery SOH is maximized over the course of the trip and upon arrival at the destination 404.

Figure 5:
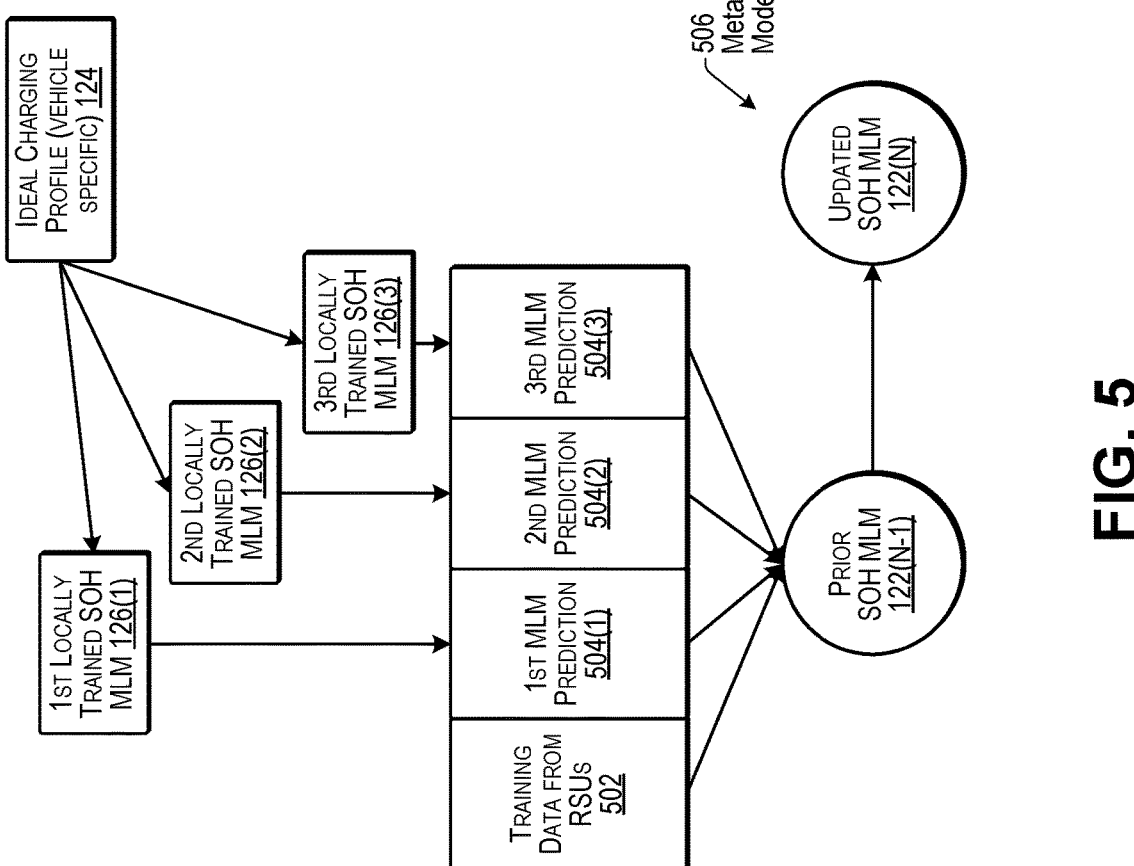
FIG. 5 illustrates an example of an ensemble learning technique for combining the learnings of multiple locally trained heterogenous SOH machine learning models (MLMs) according to some implementations.

FIG. 5 illustrates an example 500 of an ensemble learning technique for combining the learnings of multiple locally trained heterogenous SOH MLMs according to some implementations. For example, as illustrated in FIG. 5, suppose there are three locally trained SOH MLMs 126(1)-126(3) in this example that have been received by the service computing device 108 from three separate charging stations (not shown in FIG. 5) for a particular trip of the vehicle 102, and which may be referred to as "level 0" models. Furthermore, suppose that training data 502 has been received from the RSUs indicating discharge rates for the same trip. Accordingly, the predictions 504(1), 504(2), and 504(3), respectively, from each locally trained SOH MLM 126(1), 126(2), and 126(3) may be generated by inputting the ideal charging profile data 124 received from the battery manufacturer, and these predictions 504(1)-504(3) may be combined with the training data 502 from the RSUs as training data that is used to train a "level 1" meta model 506, i.e., SOH MLM 122(N), by retraining the immediately prior SOH MLM 122(N−1) received from the OEM or fleet operator. The retrained SOH MLM 122(N) may then be used by the vehicle 102 or the service computing device 108 to make an SOH prediction for the battery of the vehicle 102 for a trip.

Figure 6:
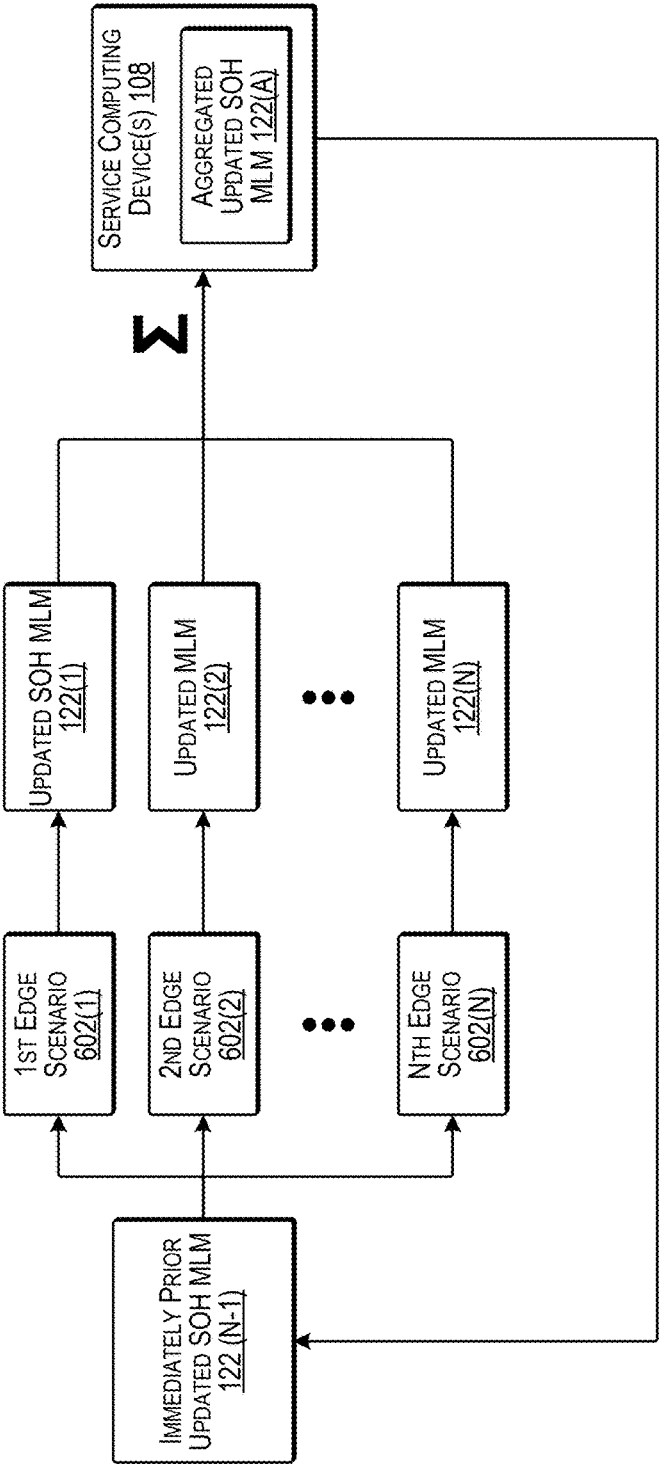
FIG. 6 illustrates an example of federated learning that is used in combination with the ensemble learning of FIG. 5 for obtaining a meta model according to some implementations.

FIG. 6 illustrates an example 600 of federated learning that is used in combination with the ensemble learning of FIG. 5 for obtaining a meta model according to some implementations. For example, the SOH MLM 122 may be repeatedly retrained for every trip taken by the vehicle 102 based on current real-time data from the different information providers, such as the charging stations and the RSUs, for the corresponding trip. In the example of FIG. 6, each trip may be a new edge scenario 602. The SOH MLM 122 is trained in a federated fashion with the updated data for a new trip, and the newly trained SOH MLM is added to the previously trained SOH MLMs to create an aggregated SOH MLM 122(A). Thus, a federated learning approach is used to train a decentralized MLM (e.g., deep neural network) across multiple edge scenarios 602(1)-602(N). This enables collaborative training of a shared model while ensuring the training data stays local, without being shared outside the service provider.

Further, because the SOH MLMs 126 from the charging stations are heterogeneous, the ensemble learning approach discussed above with respect to FIG. 5 is used to combine these models and newly received training data to obtain the updated SOH MLM 122(N) (i.e., the meta model 506 of FIG. 5) from the training of the immediately prior SOH MLM 122(N−1). The retrained updated SOH MLM 122(N) may be used by the vehicle 102 to make predictions for SOH estimation based on a selected route. In addition, the updated SOH MLM 122(N) may be provided to the OEM or fleet operator and added to the previously updated SOH MLMs 122(1 to N−1) to create an updated aggregated SOH MLM 122(A). Thus, the aggregated SOH MLM 122(A) is used as the immediately prior SOH MLM 122(N−1) the next time the SOH MLM 122 is updated. This enables the historical charging and discharge data of the battery to continue to be relevant in the updated versions of the SOH MLM 122.

FIGS. 7-15 include flow diagrams illustrating example processes according to some implementations. The processes are illustrated as collections of blocks in logical flow diagrams, which represent a sequence of operations, some or all of which can be implemented in hardware, software or a combination thereof. In the context of software, the blocks may represent computer-executable instructions stored on one or more computer-readable media that, when executed by one or more processors, program the processors to perform the recited operations. Generally, computer-executable instructions include routines, programs, objects, components, data structures and the like that perform particular functions or implement particular data types. The order in which the blocks are described should not be construed as a limitation. Any number of the described blocks can be combined in any order and/or in parallel to implement the process, or alternative processes, and not all of the blocks need be executed. For discussion purposes, the processes are described with reference to the environments, systems, and devices described in the examples herein, although the processes may be implemented in a wide variety of other environments, systems, and devices.

FIG. 7 is a flow diagram illustrating an example process 700 for predicting a battery SOH for a trip according to some implementations. In some examples, the process 700 may be executed by the system 100 discussed above. For example, some or all of the process 700 may be executed by the vehicle computing device(s) 104. As one example, the vehicle program 118 may be executed by the vehicle computing device 104 to initiate a request for an updated SOH MLM 122 from the service computing device(s) 108, such as based on a selected route for an upcoming trip. For instance, a request may be sent to the service computing device(s) 108 with the information on destination, vehicle identifier (ID), battery ID and current state of charge (SOC). The system may provide an updated model based on the available charging stations 112, RSUs, road topology, etc. In some examples, a flag may be set to indicate that an updated SOH MLM is available once the updated model has been retrained. The vehicle receives the updated SOH MLM, such as from the blockchain and may use the updated SOH MLM model for SOH estimation along the route. As one example, the SOH estimations may be presented in real-time along the route, such as by being displayed in the vehicle's human-machine interface 222 (e.g., a display in some examples) discussed above with respect to FIG. 2.

At 702, the vehicle computing device 104 may determine a destination location, start location, vehicle identifier, battery identifier, and current battery state of charge.

At 704, the vehicle computing device 104 may register the data determined at 702 to the blockchain network.

At 706, the vehicle computing device 104 may determine whether to download an update to the SOH MLM. For example, the computing device 104 may check whether a flag has been set to indicate that an updated SOH MLM is available. If so, the process goes to 708. If not, the process goes to 710.

At 708, the vehicle computing device 104 may obtain updated SOH MLM parameters from the blockchain network, and may reset the update flag to "off", or to otherwise indicate that an update is not currently available.

At 710, based at least on the SOH MLM, the vehicle computing device 104 may predict an SOH value for the battery at the end of the trip. As one example, the SOH value for the battery may indicate a percentage of capacity remaining, or the like.

At 712, the vehicle computing device 104 may perform at least one action based on the estimated battery SOH. For example, the vehicle computing device may cause the estimated battery SOH to be presented on a display or other human-machine interface of the vehicle 102. Furthermore, the vehicle computing device may provide the estimated battery SOH to the RSUs along a route when traversing the route, such as to receive vehicle control information (e.g., a speed profile) for a road segment associated with a respective RSU. In addition, the vehicle computing device may provide the estimated battery SOH to a charging station to enable the charging station to control a charging profile for the charging the battery, such as to minimize the impact on the battery capacity and overall battery SOH in some examples.

Figure 8:
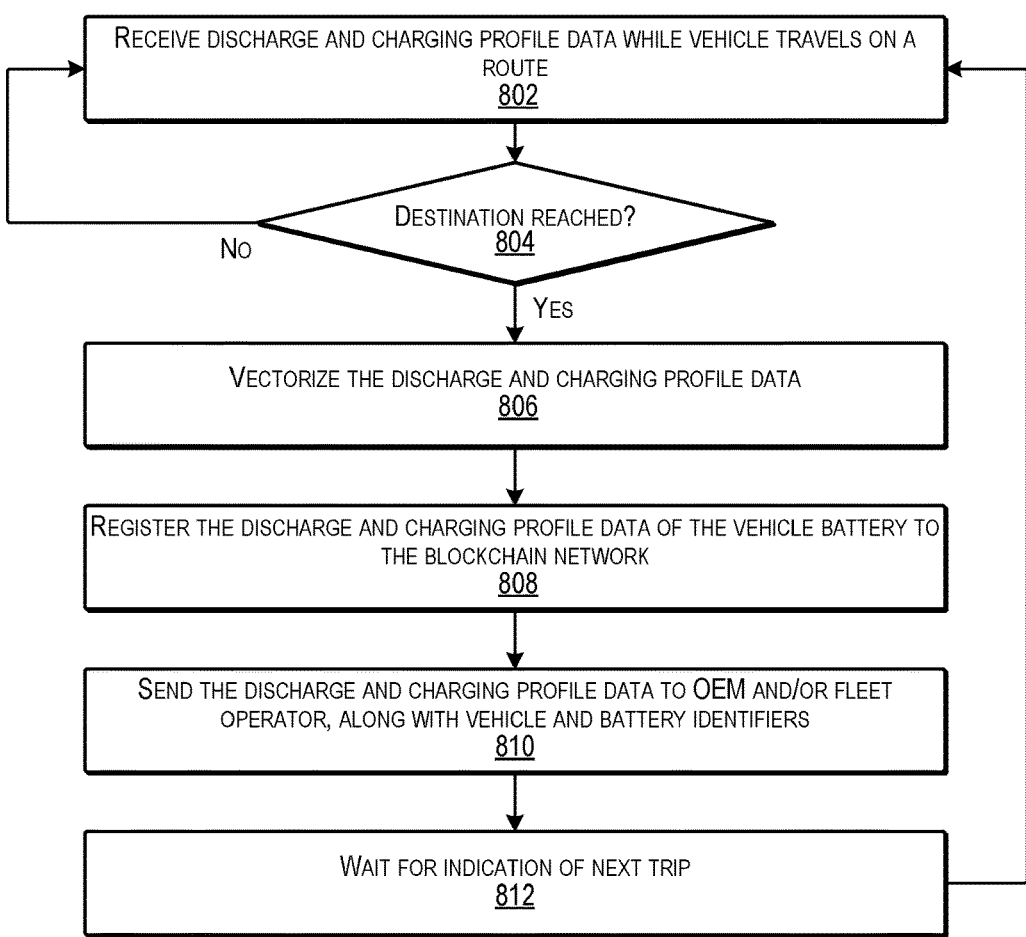
FIG. 8 is a flow diagram illustrating an example process for providing data to an original equipment manufacturer (OEM) or fleet operator at the end of a trip according to some implementations.

FIG. 8 is a flow diagram illustrating an example process 800 for providing data to an OEM or fleet operator at the end of a trip according to some implementations. In some examples, the process 800 may be executed by the system 100 discussed above. For example, at least a portion of the process 800 may be executed by the vehicle computing device(s) 104.

The vehicle program 118 may perform tracking of SOH estimations along the route and may communicate this information to the service computing device(s) 108 via RSUs along the route. After the trip has ended, all the gathered information may be compared and detailed analytics may be provided to the OEM and/or fleet operator to update the SOH MLM parameters for improving the accuracy of the SOH MLM 122.

At 802, the vehicle computing device 104 may determine discharge and charging profile data while the vehicle travels along a route.

At 804, the vehicle computing device 104 may determine whether the destination location has been reached. If not, the process returns to 802. If so, the process goes to 806.

At 806, when the destination location has been reached, the vehicle computing device 104 may vectorize the discharge and charging profile data gathered during the trip.

At 808, the vehicle computing device 104 may register the discharge and charging profile data of the vehicle battery to the blockchain network.

At 810, the vehicle computing device 104 may send the discharge and charging profile data to the OEM or the fleet operator, along with vehicle and/or battery identifiers.

At 812, the vehicle computing device 104 may wait for an indication of a next trip.

FIG. 9 illustrates an example 900 of generating a trained MLM using federated and ensemble techniques according to some implementations. In this example, the service computing device 108 may execute the SOH management program 116 to perform the process 900. The service computing device 108 may facilitate communications with multiple information providers and collect the necessary data to retrain and update SOH MLM, such as based on the route to a specified destination. The service computing device(s) 108 may receive, from the vehicle program 118, a request to receive the updated SOH MLM. The service computing device(s) 108 may authenticate the integrity of the request using the vehicle ID, battery ID, or the like. After verifying the request, the process 900 splits into three parallel processes that include communications with different information providers in the system to receive necessary information.

Using the vehicle ID and/or the associated battery ID information, the service computing device 108 requests the battery manufacturer to provide battery data, such as battery configuration, ideal charging and discharging profiles, and operational ranges. In addition, the service computing device 108 may send a request to the OEM or fleet operator to provide the immediately prior SOH MLM that will be retrained and updated with the new datasets. The data from the battery manufacturer and/or the OEM or fleet operator may be provided transmitted through the blockchain. As one example, the data stored in the blockchain network may be accessed using the vehicle ID and/or battery ID.

In addition, the service computing device 108 may receive discharge and charging profiles in real-time for the selected route from the RSUs, and this information may be combined to form training data to retrain the prior SOH MLM. Initially, the route to the destination may be selected based on various factors such as minimizing the battery discharge rate, optimizing efficiency, and/or optimizing safety. In some examples herein, the battery state of charge (SOC) is managed so as to not drop below a recommended lower threshold, such as 20 percent or the like. Therefore, the availability of at least one charging station may be desirable if there is a risk of the SOC dropping below the lower threshold. If there is a risk of this, and there is no charging station along the selected route, then alternate routes may be recommended that include at least one charging station along the route. All the RSUs 109 and charging stations 112 along the route may be identified for further processing.

The RSUs 109 may provide real-time traffic data that may be used to determine the discharge profiles based on the detected current speeds of vehicles near to the respective RSUs. The RSUs along the selected route may share speed profile data to the service computing device 108, such as via the blockchain network. Based on the configuration and discharge rates defined by the battery manufacturer, the speed profiles may be converted to battery-specific discharge profiles. The previous SOH MLM may be used to determine the SOH estimations for the acquired discharge profiles to form the training data for current iteration.

In addition, the identified charging stations 112 along the selected route are requested to share their locally trained SOH MLMs. These locally trained SOH MLMs may be proprietary to the respective operator of the respective charging stations 112 and may typically be heterogeneous. Implementations herein may employ a stacked learning technique in ensemble learning, as discussed above with respect to FIG. 5, to stack all the predictions from each locally trained SOH MLM and use these along with the training data received from the RSUs for training the final model. The input data may be determined from the ideal charging and discharging profiles acquired from the battery manufacturer. The SOH estimation of each locally trained SOH MLM from each of the charging stations 112 may be stacked alongside the ideal charging and discharging data, and the real-time data from the RSUs, to form the training data for updating the previous SOH MLM.

With the newly prepared training data based on the real-time data from RSUs and the predictions from the locally trained SOH MLMs received from the charging stations 112, the previous SOH MLM may be retrained in a federated fashion. The updated SOH MLM is registered onto the blockchain network, along with an updated flag indicating that the SOH MLM model has been updated. The vehicle program may then proceed with updating the SOH MLM on the vehicle when the flag has been changed to "true", or to otherwise indicate that an update is available.

At 902, the service computing device 108 may receive data from the vehicle, which may include the destination, start location, vehicle ID, battery ID and current battery state of charge (SOC).

At 904, the service computing device 108 may authenticate and identify the vehicle sending the information, such as based on the vehicle ID, battery ID, or the like.

At 906, based at least on the battery ID, the service computing device 108 may receive battery data from the battery manufacturer, such as battery configuration, battery operating range, battery operating limits, ideal charging profile or the like. This operation may correspond at least in part to operation 1302 of FIG. 13.

At 908, the service computing device 108 may store received data in local variables. For example, the battery manufacturer may store the requested information onto the blockchain, and the service computing device 108 may access the blockchain to obtain the requested information. In some examples, the information may have been stored on the blockchain in encrypted format and the service computing device 108 may employ a decryption key or other encryption/decryption information for decrypting the information stored on the blockchain. Following receipt of the requested battery data, this branch of the process may proceed to part A of FIG. 10.

At 910, the service computing device 108 may determine a route from the start location to the destination location based on one or more of minimizing the discharge rate, optimizing the efficiency, or optimizing the safety of the vehicle.

At 912, the service computing device 108 may determine whether the state of charge is likely to fall below 20 percent before the vehicle reaches the destination location. If so, the process goes to 914. If not, the process goes to part B of FIG. 10.

At 914, when there is a likelihood that the SOC will fall below 20 percent before the vehicle reaches the destination location, the service computing device 108 may determine a location along the route at which the battery SOC is predicted to reach 20 percent.

At 916, the service computing device 108 may determine and list charging stations and RSUs in a vicinity (such as within a threshold distance) of the location along the route at which the battery SOC is predicted to reach 20 percent.

At 918, the service computing device 108 may determine whether there is at least one charging station in the vicinity. If so, the process proceeds to part B of FIG. 10. If not, the process returns to 910 to determine a different route from the start location to the destination location.

At 920, based at least on the vehicle ID or the battery ID, the service computing device 108 may receive, from the OEM or fleet operator, the immediately prior SOH MLM or at least data related to the prior SOH MLM, such as model parameters, initial conditions, or the like. This branch of the process may then proceed to part C of FIG. 11.

FIG. 10 illustrates a continuation of the example process 900 according to some implementations.

At 1002, continuing from part B of FIG. 9, the service computing device 108 may request speed profile data from each RSU, such as based on the RSU IDs previously determined for the selected route.

At 1004, the service computing device 108 may receive the requested speed profile data from each RSU oh to which a request was sent.

At 1006, the service computing device 108 may vectorize the speed profile data received from the RSUs.

At 1008, the service computing device 108 may determine the discharge profile data corresponding to each speed profile received from the RSUs. For example, the service computing device 108 may be to determine how quickly the battery is likely to discharge based on the vectorized speed profile data. This portion of the process may then proceed to part D of FIG. 11.

At 1010, the service computing device 108 may request locally trained MLMs from the identified charging stations using respective charging station identifiers.

At 1012, the service computing device 108 may receive the locally trained MLMs from the respective charging stations to which requests were sent.

At 1014, the service computing device 108 may prepare the received locally trained MLMs for stacked ensemble learning.

At 1016, based at least on the ideal charging data previously received from the battery manufacturer, the service computing device 108 may determine predictions from the received locally trained MLMs. This part of the process may then proceed to part E of FIG. 11

FIG. 11 illustrates a continuation of the example process 900 according to some implementations.

At 1102, continuing from parts C and D of FIG. 9, and based at least on the discharge data received from the RSUs, the service computing device 108 may determine predictions using the previously iterated SOH MLM received from the OEM/FO (e.g., as discussed above with respect to FIG. 1).

At 1104, continuing from part E of FIG. 10 and block 1102, the service computing device 108 may stack and vectorize the predicted data from the predictions generated using the locally trained MLMs received from the charging stations.

At 1106, continuing from block 1104 and part C of FIG. 9, the service computing device 108 may perform federated-ensemble learning by receiving the previously iterated SOH MLM and retraining the SOH MLM as a meta model using the ensemble-stacked data.

At 1108, the service computing device 108 may register at least the updated SOH MLM parameters to the blockchain network computing devices and may trigger the flag to indicate to the vehicle computing device that an updated SOH MLM is available.

At 1110, the service computing device 108 may send the updated SOH MLM parameters to the vehicle upon request (e.g., in response to block 708 of FIG. 7). For example, the vehicle may access the blockchain 246 (not shown in FIG. 11) to access the updated SOH MLM parameters, or in other examples, the entire updated SOH MLM.

FIG. 12 illustrates an example process 1200 that may be performed by the computing device of the OEM or fleet operator according to some implementations. In this example, the OEM or fleet operator computing device 210 may store and maintain the vehicle data such as the SOH MLM parameters, historic charging and discharging profiles, and post trip analytics. As indicated at 1202, the OEM or fleet operator computing device 210 may register the previously updated SOH MLM to the blockchain network and update the service computing device 108 when requested. Additionally, as indicated at 1204, at the end of each trip, the OEM or fleet operator computing device may update the SOH MLM using the data determined at the end of each trip. The OEM or fleet operator computing device may also have access to the vehicle data to enable other functionalities using the data, such as, scheduling maintenance, tracking the vehicle usage, identifying the battery end of life, and so forth.

At 1206, the OEM or fleet operator computing device may register the retrained updated MLM to the blockchain network.

At 1208, the OEM or fleet operator computing device may send the SOH MLM parameters to the service provider in response to receiving a request from the service computing devices 108.

At 1210, the OEM or fleet operator computing device may receive discharge and charging profile data from the vehicle, such as at the end of a trip traversed by the vehicle.

At 1212, the OEM or fleet operator computing device may vectorize the received discharge and charging profile data.

At 1214, the OEM or fleet operator computing device may retrain the SOH MLM based on the newly received discharge and charging data.

Figure 13:
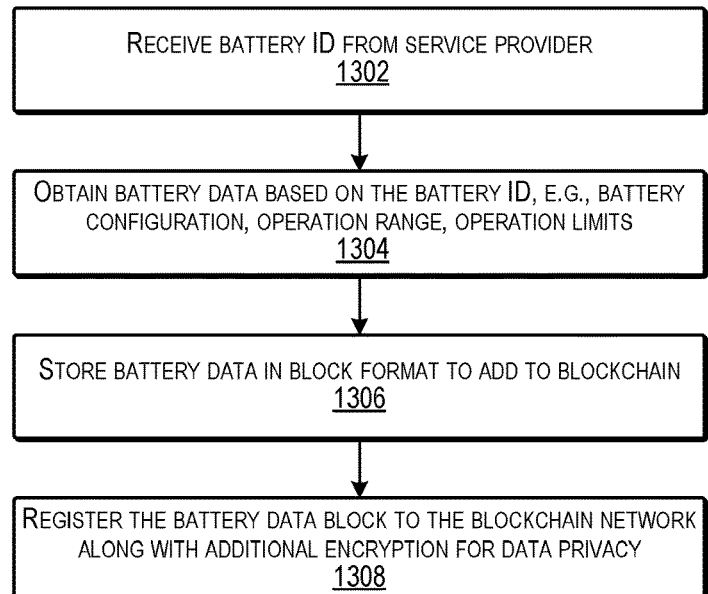
FIG. 13 illustrates an example process that may be performed by the battery manufacturer computing device according to some implementations.

FIG. 13 illustrates an example process 1300 that may be performed by the battery manufacturer computing device according to some implementations. In this example, the battery manufacturer computing device 211 may be configured to share battery-specific data with the service provider 107 and certain OEMs or fleet operators. However, it may not be desirable for the battery data to be accessible by other parties that may be able to access the blockchain. Therefore, an additional encryption layer is added to the data blocks in the blockchain, such that only authorized parties are able to decrypt the battery data. For example, the ideal charging and discharging profiles may be proprietary and/or considered confidential by the battery manufacturer, and therefore access to this information may be limited to the service provider 107 and other parties with whom the battery manufacturer may have an arrangement. The SOH predictions from the charging stations' locally trained MLMs may be determined at least in part based on using the ideal charge profile of the corresponding battery manufacturer as input.

At 1302, the battery manufacturer computing device may receive a battery ID from the service computing device 108. For example, the battery ID may correspond to a vehicle for which the SOH of the battery is being tracked or otherwise managed.

At 1304, the battery manufacturer computing device may obtain battery data based on the battery ID. For example, the battery data may include battery configuration information, battery operating range, and/or battery operating limits.

At 1306, the battery manufacturer computing device may store the battery data in block format to add to the blockchain. For example, the battery manufacturer computing device may generate one or more blocks with the battery data to be added to the blockchain.

At 1308, the battery manufacturer computing device may register the battery data block(s) with the blockchain network. In some examples, additional encryption of the battery data within the blockchain blocks may be performed for data privacy of the battery data.

Figure 14:
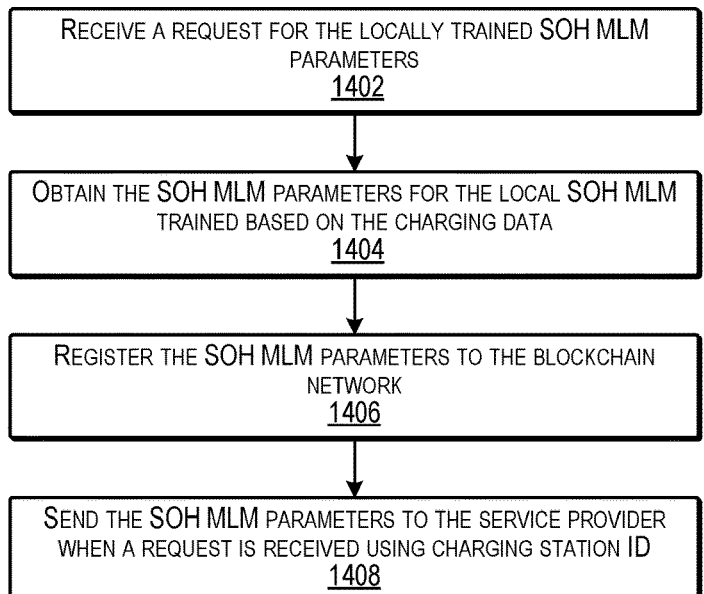
FIG. 14 illustrates an example process that may be performed by a charging station computing device according to some implementations.

FIG. 14 illustrates an example process 1400 that may be performed by a charging station computing device according to some implementations. In this example, the charging station computing device 212 may locally generate and update an MLM for the service provider 107. As mentioned above, electric vehicles can be charged using different types of chargers, such as level 1 chargers that charge at 120 volts, level 2 chargers that charge at 208-240 volts, and level 3 chargers that charge at 400-900 volts. The charging times provided by the different types of chargers can vary significantly. For example, a level 3 charger might charge over 200 times faster than a level 1 charger. However, the higher voltage of the level 3 charger may have a more substantial impact on degrading the battery health. Therefore, the type of charger that is used to charge the battery during a trip can be significant.

Charging stations may obtain and maintain data regarding the charging of different types of cars having batteries with different capacities and characteristics. However, not all charging station providers would be willing to share such data. Additionally, the large amounts of this data may make sharing of the data, such as via blockchain network, prohibitive such as due to the previously mentioned higher latencies in communications, network congestion, data exposure, and the like. Therefore, according to the examples herein the charging stations 112 may share an SOH MLM that may be based on the historic charging profiles, instead of the data itself. The locally available SOH MLM parameters may be registered into the blockchain network by the charging station computing device 112 of each charging station. This technique ensures improved data security and faster communications as the amount of data transferred to the blockchain is very small in comparison to the amount of data maintained by the charging station 112. All the SOH MLMs received from different charging stations 112 may be combined by the service computing device 108, such as by using the stacked ensemble learning technique discussed above with respect to FIGS. 1 and 5.

At 1402, the charging station computing device may receive a request for the locally trained SOH MLM parameters.

At 1404, the charging station computing device may obtain the SOH MLM parameters for the local SOH MLM trained based on the charging data maintained by the charging station.

At 1406, the charging station computing device may register the SOH MLM parameters of the local model to the blockchain network.

At 1408, the charging station computing device may send the SOH MLM parameters to the service provider when a request is received from the service computing device 108 using the charging station ID of the particular charging station.

Figure 15:
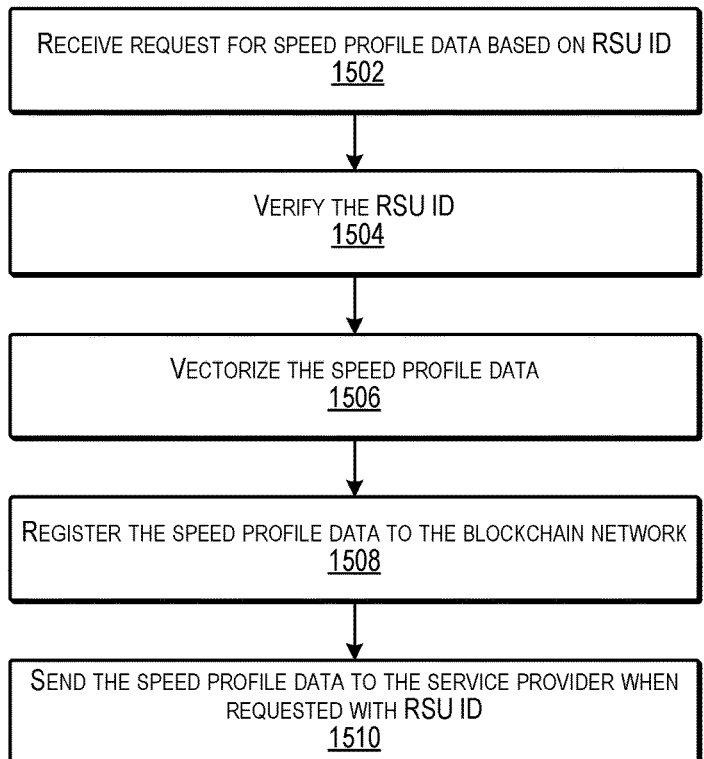
FIG. 15 illustrates an example process may be performed by a roadside unit (RSU) computing device according to some implementations.

FIG. 15 illustrates an example process 1500 may be performed by an RSU computing device according to some implementations. In this example, the RSU computing device may collect or otherwise receive real-time traffic data, and may estimate current speed profiles, such as for vehicles passing through an intersection with which the particular RSU computing device is associated. The RSUs along the selected route may be identified by the service computing device 108, such as based on an RSU ID that is specific to a respective one of the RSUs. Each RSU along the specified route may be requested to update the speed profile data and provide the speed profile data to the blockchain network. The service computing device 108 may then perform a conversion of the uploaded speed profiles to discharge profiles based on battery specific data that the service computing device 108 has received from the battery manufacturer.

At 1502, the RSU computing device of a particular RSU may receive a request to update the speed profiles to the blockchain. The request may be received based on the RSU ID of the targeted RSU.

At 1504, the RSU computing device that receives the request may perform verification of the requester to ensure that the requester is the service provider 107.

At 1506, the RSU computing device may vectorize the speed profile data prior to registering the data to the blockchain.

At 1508, the RSU computing device may add the current speed profile data of the RSU region to the blockchain network.

At 1510, the RSU computing device may send the speed profile data to the service computing device 108 in response to the request received having the RSU ID. In addition, the RSU computing device may send other information to the service computing device, such as current ambient temperature in the region, current traffic conditions, current weather conditions, and so forth. The SOH MLM 122 may be configured to take some or all of these local conditions into consideration when predicting the battery SOH.

In view of the foregoing, the estimated battery SOH for a vehicle determined from execution of the SOH MLM 122 may be used to help ensure that the vehicle battery SOH is maximized for the corresponding trip to which the battery SOH predictions apply. For example, as the vehicle 102 travels from the start location to the destination location, the vehicle 102 (e.g., the vehicle computing devices, such as in the case of a self-driving vehicle, and/or an operator, such as in the case of a human controlled vehicle) may receive informed choices of routes, recommended travel speeds at various portions of the route, and charging station(s) to use, the charging profile to use to minimize battery degradation, and so forth, which can help to ensure that the battery SOH is maintained at the highest level possible at the end of every trip.

In some cases, based on the accurate predictions of the battery SOH provided by the SOH MLM 122 herein, one or more RSUs along a specified route may provide vehicle control information, such as an accurate speed profile, to the vehicle 102 for an upcoming road, intersection, etc. (i.e., a road segment) that helps to maintain battery life or otherwise reduce battery degradation. Thus, the combination of accurate speed profiles from one or more RSUs along the route, and accurate charging rates from one or more charging stations along the route may help to maintain the maximum SOH of the battery when the vehicle 102 arrives at the destination.

Additionally, while the RSUs have been described as providing the speed profiles for various road segments in some examples herein, in other examples, the service computing device(s) 108 may provide a speed profile to the vehicle 102 for use at one or more of the road segments, including intersections or the like. Accordingly, in some examples, the RSUs are not used and/or are not present.

The system described herein facilitates secure data sharing among multiple information providers to provide protection to proprietary data. Data security and integrity can be ensured through the federated-ensemble learning technique set forth above, and an additional encryption layer may be included within the blockchain network for added data security. This increases the confidence in the information providers for encouraging participation in the system herein. Further, vehicle owners, or other operators may be provided with increased transparency regarding battery usage and for maintaining battery health, such as based on being able to make informed choices regarding routes, charging stations, and the like. Further, the system herein may leverage post-trip data and may determine recommendations to provide at the end of each trip to assist the vehicle owner, fleet operator, or the like to better manage the future trips.

The example processes described herein are only examples of processes provided for discussion purposes. Numerous other variations will be apparent to those of skill in the art in light of the disclosure herein. Further, while the disclosure herein sets forth several examples of suitable frameworks, architectures and environments for executing the processes, the implementations herein are not limited to the particular examples shown and discussed. Furthermore, this disclosure provides various example implementations, as described and as illustrated in the drawings. However, this disclosure is not limited to the implementations described and illustrated herein, but can extend to other implementations, as would be known or as would become known to those skilled in the art.

Various instructions, processes, and techniques described herein may be considered in the general context of computer-executable instructions, such as computer programs and applications stored on computer-readable media, and executed by the processor(s) herein. Generally, the terms program and application may be used interchangeably, and may include instructions, routines, modules, objects, components, data structures, executable code, etc., for performing particular tasks or implementing particular data types. These programs, applications, and the like, may be executed as native code or may be downloaded and executed, such as in a virtual machine or other just-in-time compilation execution environment. Typically, the functionality of the programs and applications may be combined or distributed as desired in various implementations. An implementation of these programs, applications, and techniques may be stored on computer storage media or transmitted across some form of communication media. Additionally, although this disclosure describes or illustrates particular embodiments as providing particular advantages, particular embodiments may provide none, some, or all of these advantages.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed:

1. A system comprising:

one or more processors configured by executable instructions to perform operations comprising:

providing, to a vehicle, a first machine learning model configured for predicting a state of health of a battery of the vehicle;

determining route information for a route to be traversed by the vehicle from a start location to a destination location;

receiving discharge data corresponding to traversal of the vehicle along the route, the discharge data indicative of a rate of discharge of the battery at a plurality of locations along the route;

receiving information related to charging of the battery along the route, including receiving a plurality of second machine learning models trained based on data from a plurality of charging stations, respectively, each respective second machine learning model having been trained separately based on local charging data associated with charging the battery at a corresponding respective charging station;

using each received respective second machine learning model to generate a respective prediction for generating a plurality of respective predictions;

retraining the first machine learning model configured for predicting the state of health of the battery using training data that includes the plurality of respective predictions generated by the plurality of respective second machine learning models; and providing at least updated parameters of the first machine learning model to the vehicle, wherein the vehicle determines an estimated battery state of health based at least on the first machine learning model, the vehicle receiving control information while traversing at least one of the route or a future route based at least on the estimated battery state of health, wherein the vehicle is controlled during traversal of the at least one of the route or the future route based at least in part on the received control information to at least in part minimize battery degradation during traversal of the at least one of the route or the future route.

2. The system as recited in claim 1, further comprising an operation of aggregating an updated first machine learning model with at least one prior first machine learning model to generate an aggregated first machine learning model whose parameters are sent to the vehicle when providing at least the updated parameters of the first machine learning model to the vehicle.

3. The system as recited in claim 1, wherein, based on reaching the destination, the vehicle executes the first machine learning model to determine a current estimated battery state of health, and wherein the vehicle sends feedback regarding the first machine learning model to at least one entity that maintains the first machine learning model.

4. The system as recited in claim 1, wherein, during traversal of the route, the vehicle provides the estimated battery state of health to a first charging station of the plurality of charging stations, wherein the first charging station controls a charging profile during charging of the battery based at least on the estimated battery state of health.

5. The system as recited in claim 1, the operations further comprising:

while the vehicle is traversing the route, receiving at least speed profile data from a plurality of roadside units positioned along the route, the roadside units transmitting the speed profile data to the one or more processors, wherein the speed profile data is indicative of discharge of the vehicle battery in a vicinity of a respective roadside unit; and converting the received speed profile data to discharge data for the vehicle based at least on battery profile information associated with the battery.

6. The system as recited in claim 5, wherein the training data further includes one or more discharge profiles received from one or more roadside units of the plurality of roadside units.

7. The system as recited in claim 1, wherein the training data further includes an ideal charging profile for the battery received from a manufacturer of the battery.

8. A method comprising:

providing, by one or more processors, to a vehicle, a first machine learning model configured for predicting a state of health of a battery of the vehicle;

determining, by the one or more processors, route information for a route to be traversed by the vehicle from a start location to a destination location;

receiving discharge data corresponding to traversal of the vehicle along the route, the discharge data indicative of a rate of discharge of the battery at a plurality of locations along the route;

receiving information related to charging of the battery along the route, including receiving a plurality of second machine learning models trained based on data from a plurality of charging stations, respectively, each respective second machine learning model having been trained separately based on local charging data associated with charging the battery at a corresponding respective charging station;

using each received respective second machine learning model to generate a respective prediction for generating a plurality of respective predictions;

retraining the first machine learning model configured for predicting the state of health of the battery using training data that includes the plurality of respective predictions generated by the plurality of respective second machine learning models; and providing at least updated parameters of the first machine learning model to the vehicle, wherein the vehicle determines an estimated battery state of health based at least on the first machine learning model, the vehicle receiving control information while traversing at least one of the route or a future route based at least on the estimated battery state of health, wherein the vehicle is controlled during traversal of the at least one of the route or the future route based at least in part on the received control information to at least in part minimize battery degradation during traversal of the at least one of the route or the future route.

9. The method as recited in claim 8, further comprising aggregating an updated first machine learning model with at least one prior first machine learning model to generate an aggregated first machine learning model whose parameters are sent to the vehicle when providing at least the updated parameters of the first machine learning model to the vehicle.

10. The method as recited in claim 8, wherein, during traversal of the route, the vehicle provides the estimated battery state of health to a first charging station of the plurality of charging stations, wherein the first charging station controls a charging profile during charging of the battery based at least on the estimated battery state of health.

11. The method as recited in claim 8, further comprising:

while the vehicle is traversing the route, receiving at least speed profile data from a plurality of roadside units positioned along the route, the roadside units transmitting the speed profile data to the one or more processors, wherein the speed profile data is indicative of discharge of the vehicle battery in a vicinity of a respective roadside unit; and converting the received speed profile data to discharge data for the vehicle based at least on battery profile information associated with the battery.

12. The method as recited in claim 11, wherein the training data further includes one or more discharge profiles received from one or more roadside units of the plurality of roadside units.

13. The method as recited in claim 8, wherein the training data further includes an ideal charging profile for the battery received from a manufacturer of the battery.

14. A non-transitory computer-readable medium storing instructions executable by one or more processors to cause the one or more processors to perform operations comprising:

providing, to a vehicle, a first machine learning model configured for predicting a state of health of a battery of the vehicle;

determining route information for a route to be traversed by the vehicle from a start location to a destination location;

receiving discharge data corresponding to traversal of the vehicle along the route, the discharge data indicative of a rate of discharge of the battery at a plurality of locations along the route;

receiving information related to charging of the battery along the route, including receiving a plurality of second machine learning models trained based on data from a plurality of charging stations, respectively, each respective second machine learning model having been trained separately based on local charging data associated with charging the battery at a corresponding respective charging station;

using each received respective second machine learning model to generate a respective prediction for generating a plurality of respective predictions;

retraining the first machine learning model configured for predicting the state of health of the battery using training data that includes the plurality of respective predictions generated by the plurality of respective second machine learning models;

providing at least updated parameters of the first machine learning model to the vehicle, wherein the vehicle determines an estimated battery state of health based at least on the first machine learning model, the vehicle receiving control information while traversing at least one of the route or a future route based at least on the estimated battery state of health, wherein the vehicle is controlled during traversal of the at least one of the route or the future route based at least in part on the received control information to at least in part minimize battery degradation during traversal of the at least one of the route or the future route.

15. The non-transitory computer-readable medium as recited in claim 14, further comprising an operation of aggregating an updated first machine learning model with at least one prior first machine learning model to generate an aggregated first machine learning model whose parameters are sent to the vehicle when providing at least the updated parameters of the first machine learning model to the vehicle.

16. The non-transitory computer-readable medium as recited in claim 14, wherein, during traversal of the route, the vehicle provides the estimated battery state of health to a first charging station of the plurality of charging stations, wherein the first charging station controls a charging profile during charging of the battery based at least on the estimated battery state of health.

17. The non-transitory computer-readable medium as recited in claim 14, the operations further comprising:

while the vehicle is traversing the route, receiving at least speed profile data from a plurality of roadside units positioned along the route, the roadside units transmitting the speed profile data to the one or more processors, wherein the speed profile data is indicative of discharge of the vehicle battery in a vicinity of a respective roadside unit; and converting the received speed profile data to discharge data for the vehicle based at least on battery profile information associated with the battery.

18. The non-transitory computer-readable medium as recited in claim 17, wherein the training data further includes one or more discharge profiles received from one or more roadside units of the plurality of roadside units.

19. The non-transitory computer-readable medium as recited in claim 14, wherein the training data further includes an ideal charging profile for the battery received from a manufacturer of the battery.

* * * * *